United States Patent [19]
Gonzalez et al.

[11] Patent Number: 5,168,073
[45] Date of Patent: Dec. 1, 1992

[54] METHOD FOR FABRICATING STORAGE NODE CAPACITOR HAVING TUNGSTEN AND ETCHED TIN STORAGE NODE CAPACITOR PLATE

[75] Inventors: Fernando Gonzalez; Roger R. Lee, both of Boise, Id.

[73] Assignee: Micron Technology, Inc., Boise, Id.

[21] Appl. No.: 786,143

[22] Filed: Oct. 31, 1991

[51] Int. Cl.$^5$ ............... H01L 21/265; H01L 21/70
[52] U.S. Cl. ........................ 437/47; 437/52; 437/60; 437/919
[58] Field of Search ............ 437/47, 48, 51, 60, 437/919; 357/23.6, 51; 365/149

[56] References Cited

U.S. PATENT DOCUMENTS

| | | | |
|---|---|---|---|
| 4,974,040 | 11/1990 | Taguchi et al. | 357/23.6 |
| 5,005,072 | 4/1991 | Gonzalez | 357/23.6 |
| 5,006,481 | 4/1991 | Chan et al. | 437/52 |
| 5,021,357 | 6/1991 | Taguchi et al. | 437/47 |
| 5,049,517 | 9/1991 | Liu et al. | 437/47 |
| 5,053,351 | 10/1991 | Fatan et al. | 437/47 |
| 5,100,825 | 3/1992 | Fatan et al. | 437/52 |

OTHER PUBLICATIONS

IEDM, pp. 592–595, Fijitsu Laboratories Limited 1988 3-Dimensional Stacked Capacitor Cell for 16M and 64M DRAMs.

*Primary Examiner*—Olik Chaudhuri
*Assistant Examiner*—Loc Q. Trinh

[57] ABSTRACT

A dynamic random access memory (DRAM) storage cell having a storage contact capacitor comprising a tungsten and TiN storage node capacitor plate and the method for fabricating the same. At least a portion of the storage node capacitor plate is formed vertically in the DRAM. The TiN is controllably etched to increase the area of the storage node capacitor plate. An upper poly layer functions as the cell plate and is insulated from the storage node capacitor plate by a dielectric layer.

24 Claims, 22 Drawing Sheets

METHOD FOR FABRICATING STORAGE NODE CAPACITOR HAVING TUNGSTEN AND ETCHED TIN STORAGE NODE CAPACITOR PLATE

FIELD OF THE INVENTION

This invention relates to semiconductor technology and, more particularly, to cell capacitors for use in dynamic random access memories (DRAMs).

BACKGROUND OF THE INVENTION

The memory cells of dynamic random access memories (DRAMs) which are arranged in an array having a configuration of intersecting wordlines and digit lines are comprised of two main components, a field-effect transistor (FET) and a capacitor. In DRAM cells utilizing a conventional planar capacitor, far more chip surface area is dedicated to the planar capacitor than to the field-effect transistor. In a typical construction the wordlines are generally etched from a polysilicon-1 layer. A doped region of silicon substrate functions as the lower capacitor plate (storage node), while a polysilicon-2 generally functions as the upper capacitor plate (cell plate).

Although planar capacitors have generally proven adequate for use in DRAM chips up to the 1-megabit level, they are considered to be unusable for more advanced DRAM generations. As component density in memory chips has increased, the shrinkage of cell capacitor size has resulted in a number of problems. Firstly, the alpha-particle component of normal background radiation can generate hole-electron pairs in the silicon substrate, which functions as the lower capacitor plate. This phenomena will cause a charge stored within the affected cell capacitor to rapidly dissipate, resulting in a "soft" error. Secondly, the sense amplifier differential signal is reduced. This aggravates noise sensitivity and makes it more difficult to design a sense amplifier having appropriate signal selectivity. Thirdly, as cell capacitor size is decreased, the cell refresh time must generally be shortened, thus requiring more frequent interruptions for refresh overhead. The difficult goal of a DRAM designer is to increase or, at least, maintain cell capacitance as cell size shrinks, without resorting to processes that reduce product yield or that markedly increase the number of masking and deposition steps in the production process.

Some manufactures of 4-megabit DRAMs are utilizing cell designs based on nonplanar capacitors. Two basic nonplanar capacitor designs are currently in use: the trench capacitor and the stacked capacitor. Both types of nonplanar capacitors typically require a considerable greater number of masking, deposition and etching steps for their manufacture than does a planar capacitor.

In a trench capacitor, charge is stored primarily vertically, as opposed to horizontally in a planar capacitor. Since trench capacitors are fabricated in trenches which are etched in the substrate, the typical trench capacitor, like the planar capacitor, is subject to soft errors. In addition, there are several other problems inherent in the trench design. One problem is that of trench-to-trench charge leakage, caused by the parasitic transistor effect between adjacent trenches. Another problem is the difficulty of completely cleaning the trenches during the fabrication process; failure to completely clean a trench will generally result in a defective cell.

The stacked capacitor design, on the other hand, has proven somewhat more reliable and easier to fabricate than the trench design. Since both the lower and the upper plates of a typical stacked capacitor are formed from individual polysilicon layers, the stacked capacitor is generally much less susceptible to soft errors than either the planar or trench capacitors. By placing both the wordline and the digit line beneath the capacitive layers, and having the lower layer make contact with the substrate by means of a buried contact, some manufacturers have created stacked capacitor designs in which vertical portions of the capacitor contribute significantly to the total charge storing capacity. Since a stacked capacitor generally covers not only the entire area of a cell (including the cell's access FET), but adjacent field oxide regions as well, capacitance is considerably enhanced over that available from a planar type cell.

The method for forming the typical fin configuration stacked capacitor uses polysilicon/nitride layers to implement spacing of the fins. The method is complicated and employs multi depositions and subsequent etch steps to create this stacked capacitor fin structure.

One experimental storage-node capacitor comprises the double-wall crown shaped lower capacitor plate structure wherein the fabrication of the structure is initiated by etching an opening in an $SiO_2$ interlayer in order to expose a contact area of the substrate. Polycrystalline silicon is then deposited to overlie the surface of the $SiO_2$ interlayer and the substrate contact area. Next portions of $SiO_2$ are formed adjacent to the polycrystalline silicon overlying sidewalls of the opening. A second polycrystalline silicon layer is then deposited overlying the portions of $SiO_2$ and overlying and contacting the polycrystalline silicon overlying the contact area. The remaining portion of the opening is filled with $SiO_2$. The polycrystalline silicon overlying the $SiO_2$ is etched and then the $SiO_2$ is etched. The remaining polycrystalline silicon comprises the lower capacitor plate of a storage node capacitor. Thus the lower capacitor plate comprises a two layer lower portion of polycrystalline silicon in contact with the substrate and having four vertical fingers extending from the lower portion.

Other alternatives for increasing capacitance comprise utilizing materials having larger dielectric constants, decreasing the thickness of the dielectric (decreasing the distance between the capacitor plates), or increasing capacitor surface area by texturizing the poly silicon surface.

SUMMARY OF THE INVENTION

The invention is a product and method for forming same comprising a storage contact capacitor of a dynamic random access memory (DRAM) device wherein the lower storage node capacitor plate comprises tungsten and TiN portions. An initial TiN region is self-aligned to and in contact with the contact area of the substrate. The initial tungsten portion is embedded in the TiN region. The storage contact capacitor of the invention utilizes the vertical portion of the DRAM by fabricating at least a portion of the storage node capacitor plate vertically in the DRAM. The vertical fabrication increases capacitor area while maximizing die space.

The capacitor area is increased by forming at least one cavity surrounding at least one upper portion of the tungsten. The cavity is formed by controllably etching portions of the TiN. The fabrication of the storage capacitor is complete following the deposition of a dielectric layer to overlie exposed TiN and tungsten portions and a previously fabricated oxide portion. Cell polysilicon is deposited to overlie the dielectric layer, the cell polysilicon forming the cell plate. A conductive material is then deposited to overlie the cell plate and function as a cell plate contact.

In a first embodiment only one layer of TiN and one layer of tungsten is deposited. In a second embodiment, at least two more layers, at least one of TiN and at least one of tungsten are alternately deposited. In the second embodiment, etching the TiN layers effects an elevationally stacked fin structure of tungsten. The height of the structure is dependent on the number of alternatively layers and the thickness of the layers. TiN retained after the etch provides electrical communication between the tungsten layers as well as between the contact area of the substrate and the first deposited TiN layer.

A self-aligned opening exposing a contact region of silicon substrate is created by masking and etching previously fabricated layers of the semiconductor device. An initial TiN layer is deposited to overlie the exposed substrate and previously fabricated layers. A tungsten fill is deposited to overlie the TiN layer. At this juncture, alternating layers of TiN and tungsten may be deposited. An upper portion of the TiN is etched forming a cavity surrounding each upper portion of the tungsten layer. The tungsten and TiN comprise the storage node capacitor plate. A dielectric layer is deposited to overlie the tungsten and TiN and the previously fabricated layers. Cell polysilicon is deposited to overlie the dielectric layer and forms the cell plate.

The invention allows the vertical portion of a DRAM device to be utilized as the storage cell thus maximizing die space in the horizontal direction, and reducing the stack capacitor height prior to contacts. The TiN etch maximized the cell size by increasing the area of the storage node plate. The cell plate contact and the cell plate are self-aligned. A mask step is eliminated over previous methods since there is no cell polysilicon mask. The process facilitates the effective use of a buried digit line configuration. In addition there are no bit line stringers, thus yield is increased.

BRIEF DESCRIPTION OF THE DRAWINGS

FIG. 12 also depicts the oxidation of the polysilicon and silicide exposed during the etch.

FIG. 12 also depicts the oxidation of the polysilicon and silicide exposed during the etch.

DETAILED DESCRIPTION OF THE PREFERRED EMBODIMENT

The invention is a storage cell capacitor. Two embodiments of the invention are directed to maximizing storage cell capacitance utilizing minimal masking steps. The capacitor of each cell makes a self-aligned contact with a buried contact within the cell, while the capacitor extends to the active area of an adjacent cell. The active areas can be arranged in interdigitated columns and noninterdigitated rows or simply parallel and in line to one another in both the vertical and horizontal directions. The rows are referred to as wordlines, and the columns are referred to as digit lines or bit lines. The active areas are used to form active metal-oxide semiconductor (MOS) transistors that can be doped as NMOS or PMOS type FETs depending on the desired use. The invention is a storage contact capacitor utilizing the vertical portion of the DRAM in which to fabricate a tungsten and TiN storage node capacitor plate and the invention is the method for fabricating the same.

The process steps of the invention are shown pictorially in FIGS. 1-18. FIGS. 1-6 are pertinent to both embodiments of the invention. FIGS. 7-12 are pertinent to the first embodiment, and FIGS. 13-18 are pertinent to the second embodiment.

Figure 1:
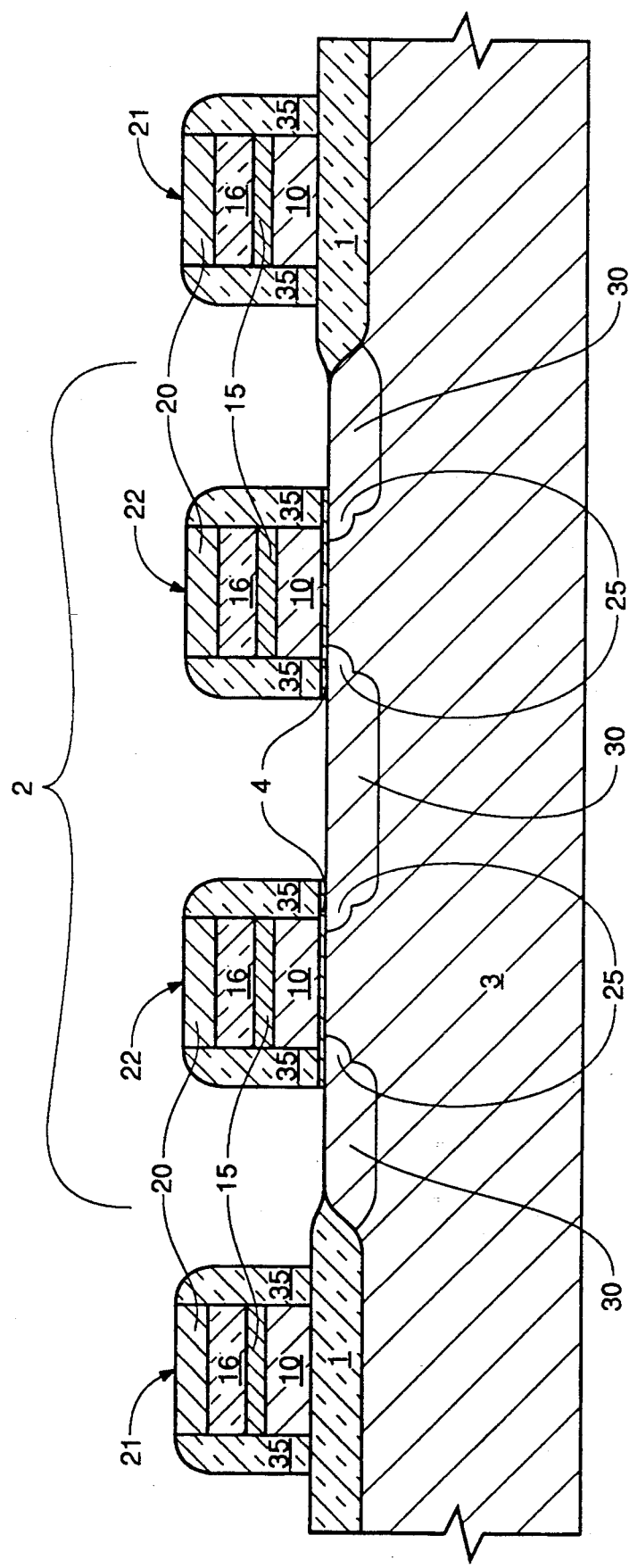
FIG. 1 is a cross-sectional view of a portion of a partially-processed semiconductor wafer which depicts field-effect transistors (FETs) overlying a silicon substrate and wordlines overlying field oxide.

Referring now to FIG. 1, a cross-sectional view of two in-process DRAM cells is shown following conventional local oxidation of silicon (LOCOS) or special LOCOS processing which creates substantially planar field oxide regions 1 (created using modified LOCOS process) and future active areas 2 (those regions of the substrate not covered by field oxide) on a silicon substrate 3. The creation of the field oxide is preceded by a thermally grown dielectric layer 4 of silicon oxide. The depicted cells are two of many cells that are fabricated simultaneously and comprise a memory array. Following the creation of the field oxide region 1 and dielectric layer 4 a first conductively doped polysilicon layer 10, a metal silicide layer (WSi$_x$) 15, an oxide layer 16, and a thick nitride layer 20 are deposited. The thick nitride layer 20 will function as an etch stop during the storage node buried contact etch, thus allowing self-alignment. The layers are patterned and etched to form wordlines 21 and N-channel (NCH) field effect transistors 22. The polysilicon layer 10 forms the gate regions of the FETs and is insulated from lightly-doped source/drain regions 25 by the dielectric layer 4. The lightly-doped regions 25 are created utilizing a phosphorus implant. Deposition, densification and a reactive ion etch (RIE) of a silicon dioxide spacer layer has created principal spacers 35 which offset an arsenic implant used to create the heavily-doped source/drain regions 30. Principal spacers 35 insulate the wordlines and FETs from subsequent digit line and capacitor fabrications. Eventually the wordlines are connected to periphery contacts. The periphery contacts are located at the end of the array and are capable of being in electrical communication with peripheral circuitry.

After the RIE etch the punchthrough improvement implant is processed to improve breakdown voltage of drain to source when V$_{Gate}$ equals zero volts (BVDSS) and to reduce subthreshold leakage. The gate oxide 4 remains intact and the field oxide is not etched.

Although the formation of the FETs 22 and wordlines 21 as described are preferred, other methods of fabrication are also feasible and perhaps equally viable.

The following steps represent the methods of the two embodiments of the invention.

Figure 2:
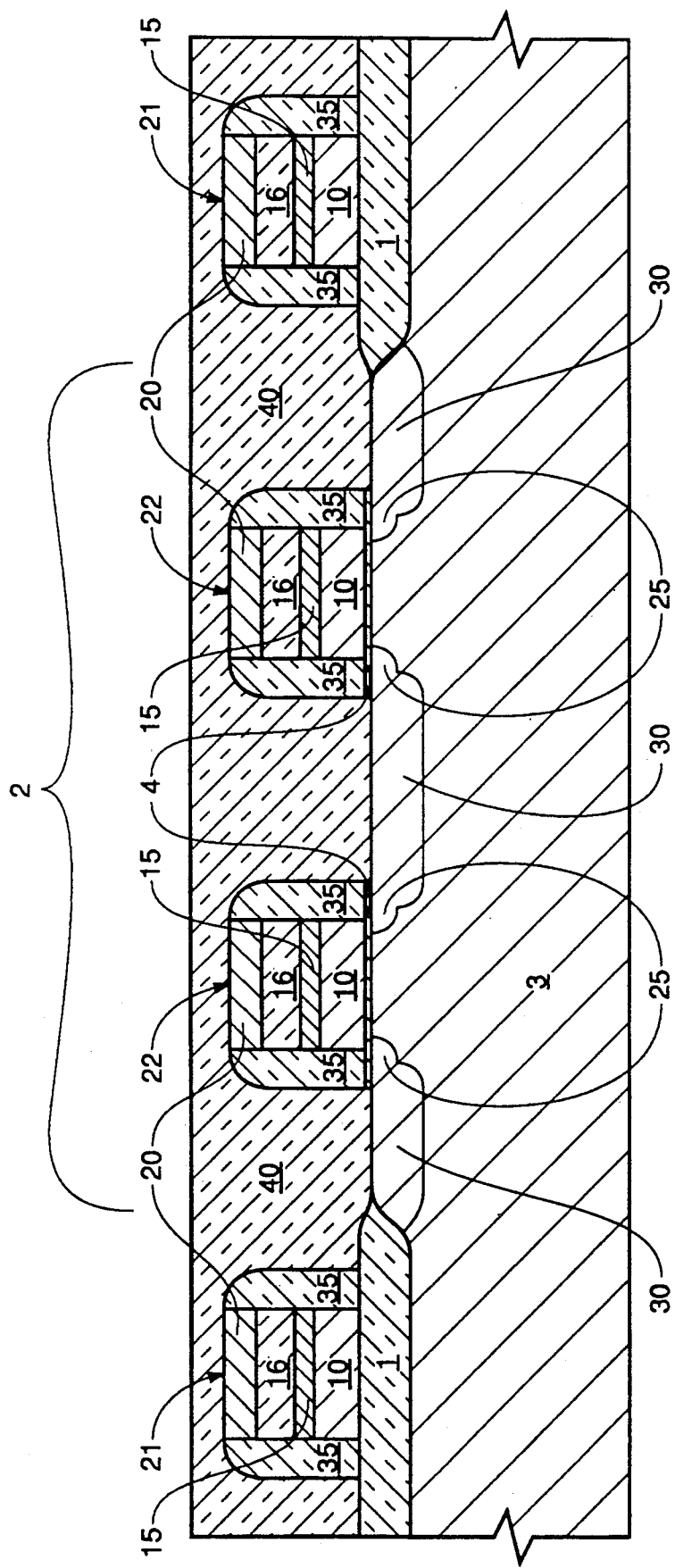
FIG. 2 is a cross-sectional view of the wafer portion of FIG. 1 following the deposit of an undoped thick oxide layer and planarization thereof.

In FIG. 2 a conformal layer of undoped oxide 40 is blanket deposited to fill the storage node areas and overlie the FETS 22 and wordlines 21. The oxide is undoped to minimize dopant out diffusion from the oxide 40 to the doped regions of the substrate. The oxide is planarized in order to provide a uniform height.

Figure 3:
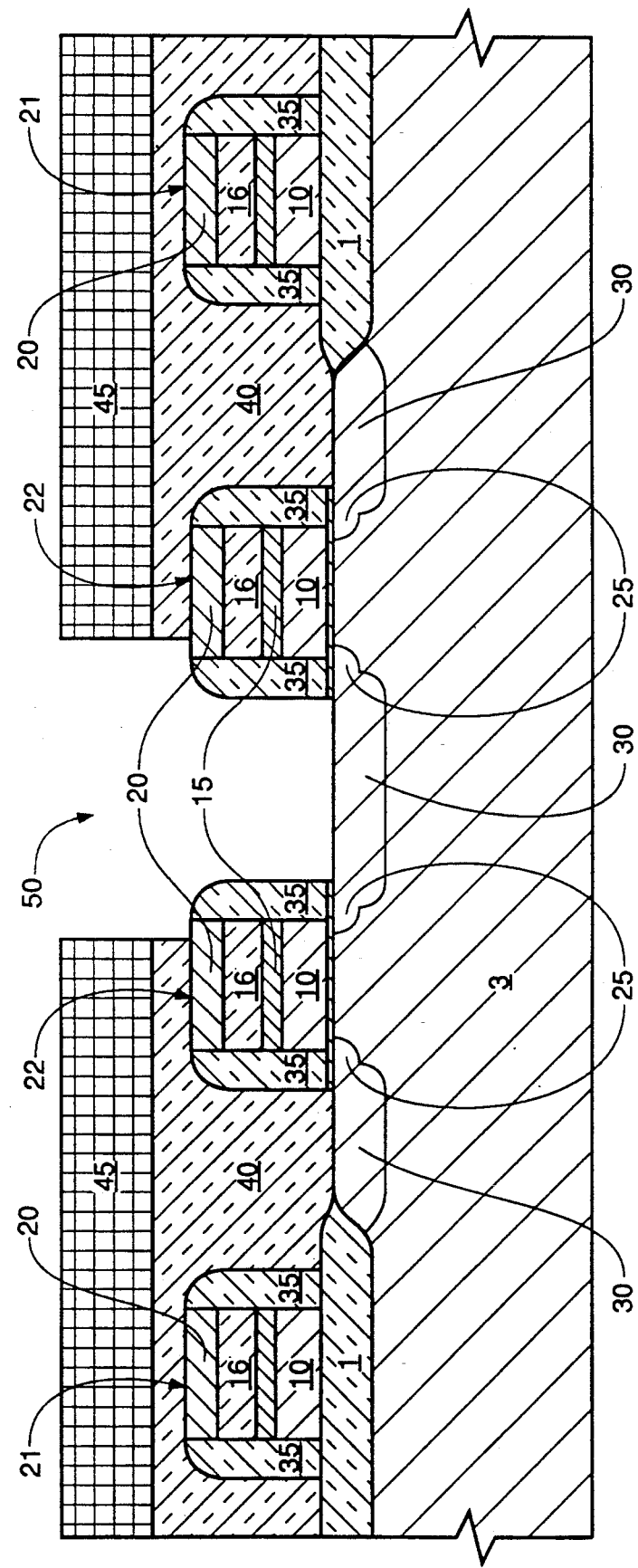
FIG. 3 is a cross-sectional view of the wafer portion of FIG. 2 following the masking and subsequent etching of the deposited oxide layer to form a self-aligned opening.

In FIG. 3 a photoresist digit line contact 45 is used as an etch mask to create an opening 50 in which buried digit lines will be fabricated. The nitride layers 20 and principal spacers 35 protect the transistor polysilicon layer 10 from the RIE oxide etch employed to form opening 50. The protection afforded by the nitride layers 20 and principal spacers 35 effect self-alignment of the opening.

Figure 4:
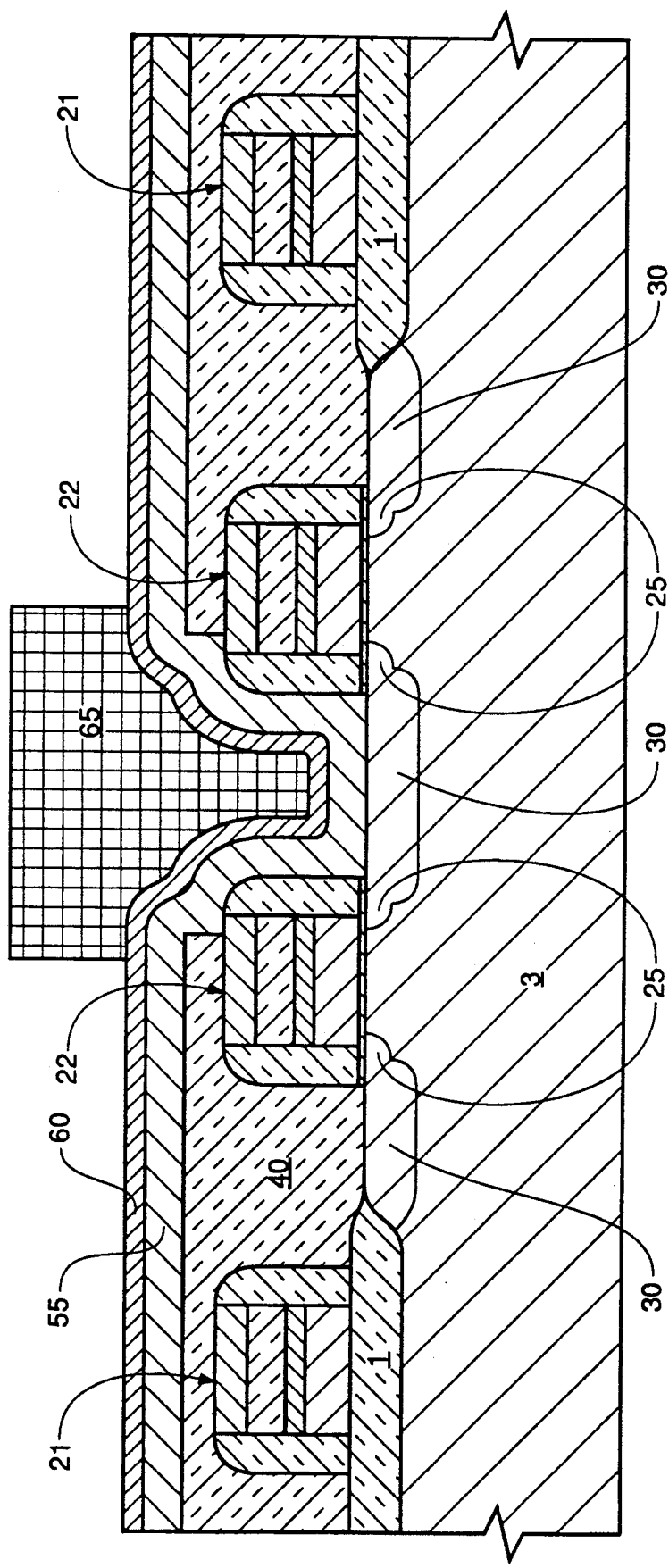
FIG. 4 is a cross-sectional view of the wafer portion of FIG. 3 following the masking of deposited layers of polysilicon and $WSi_x$.

In FIG. 4 the photoresist shown in FIG. 3 has been removed, and the previously defined structures are overlaid with a blanket deposition of polysilicon 55 which in turn is overlaid with a blanket deposition of strapping material 60 comprising WSi$_x$ or TiN. The area defined as the digit line is masked with photoresist 65.

Figure 5:
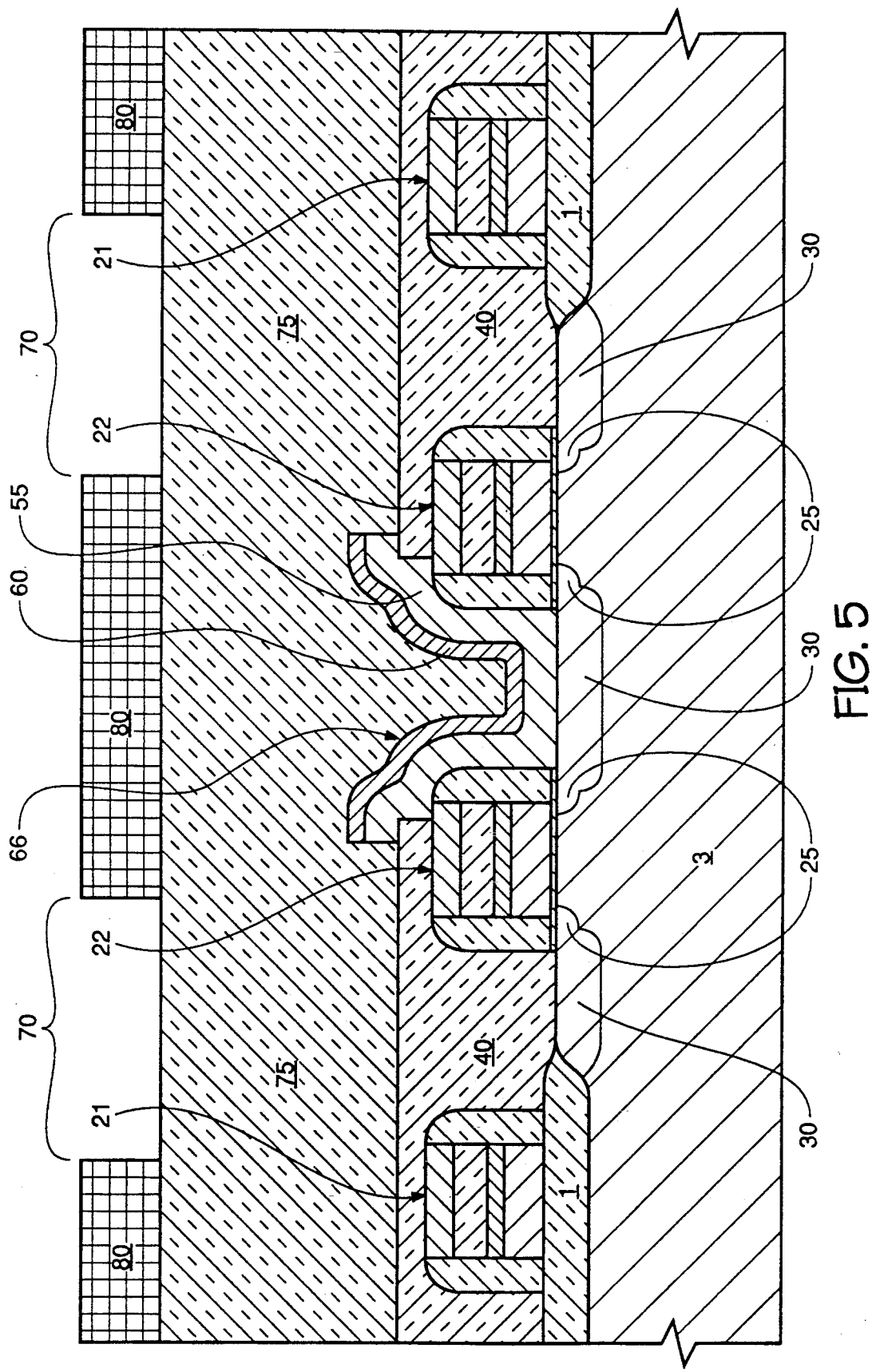
FIG. 5 is a cross-sectional view of the wafer portion of FIG. 4 following a reactive ion etch (RIE) of the deposited polysilicon and $WSi_x$ layer to form a buried digit line, the removal of the photoresist shown in FIG. 5, the deposit of a thick doped oxide layer, and masking thereof to define future contact areas for storage contact capacitors.

In FIG. 5 the unmasked polysilicon 55 and strapping material 60 are RIE etched to remove them from over the storage node areas 70 and from the top of the wordlines 21 polysilicon. The polysilicon 55 and strapping material 60 that are retained after the etch define the digit line 66. The strapping material 60 has a relatively low resistance when compared to the resistance of the polysilicon layer 55. The lower resistance of the strapping material 60 reduces the overall resistance of the digit line 66. Eventually the digit lines will be connected to periphery contacts. The periphery contacts are located at the end of the array and are capable of being in electrical communication with peripheral circuitry.

The photoresist 65 shown in FIG. 4 is removed. A thick doped layer of borophosphosilicate glass (BPSG) oxide 75 is blanket deposited to overlie the structures of FIG. 5. The thick oxide layer 75 is deposited to substantially define the desired height of a core portion of the storage capacitor. After planarization, either mechanical or chemical, the thick oxide 75 is masked with photoresist pattern 80 to define future openings in the previously fabricated structures for future storage capacitors. Planarizing the thick oxide 75 eliminates bit line stringers. The photoresist pattern 80 can also be used as a contact layer pattern for periphery contacts, thereby eliminating one mask, the buried contact mask. In this case openings would also be etched in the periphery of the DRAM device.

Figure 6:
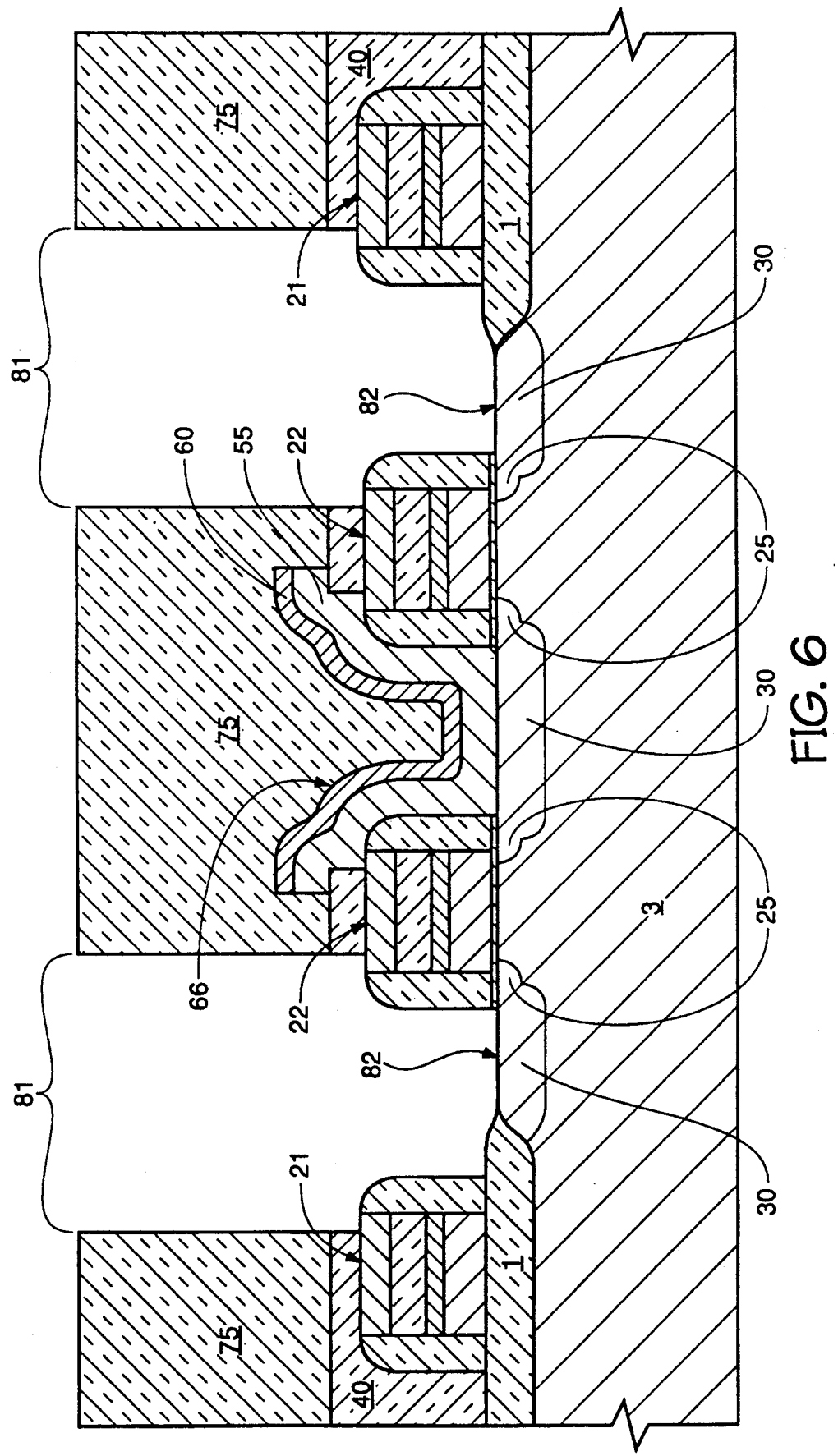
FIG. 6 is a cross-sectional view of the wafer portion of FIG. 5 following an RIE etch of the oxide layers to create openings for the lower capacitor plates as well as the contact openings for periphery contacts and following the removal of the photoresist.

In FIG. 6 the oxide layers 40 and 75 are RIE etched to form opening 81 and expose the contact areas 82 of the substrate. Following the etch, the photoresist 80 shown in FIG. 5 is removed.

Figure 7:
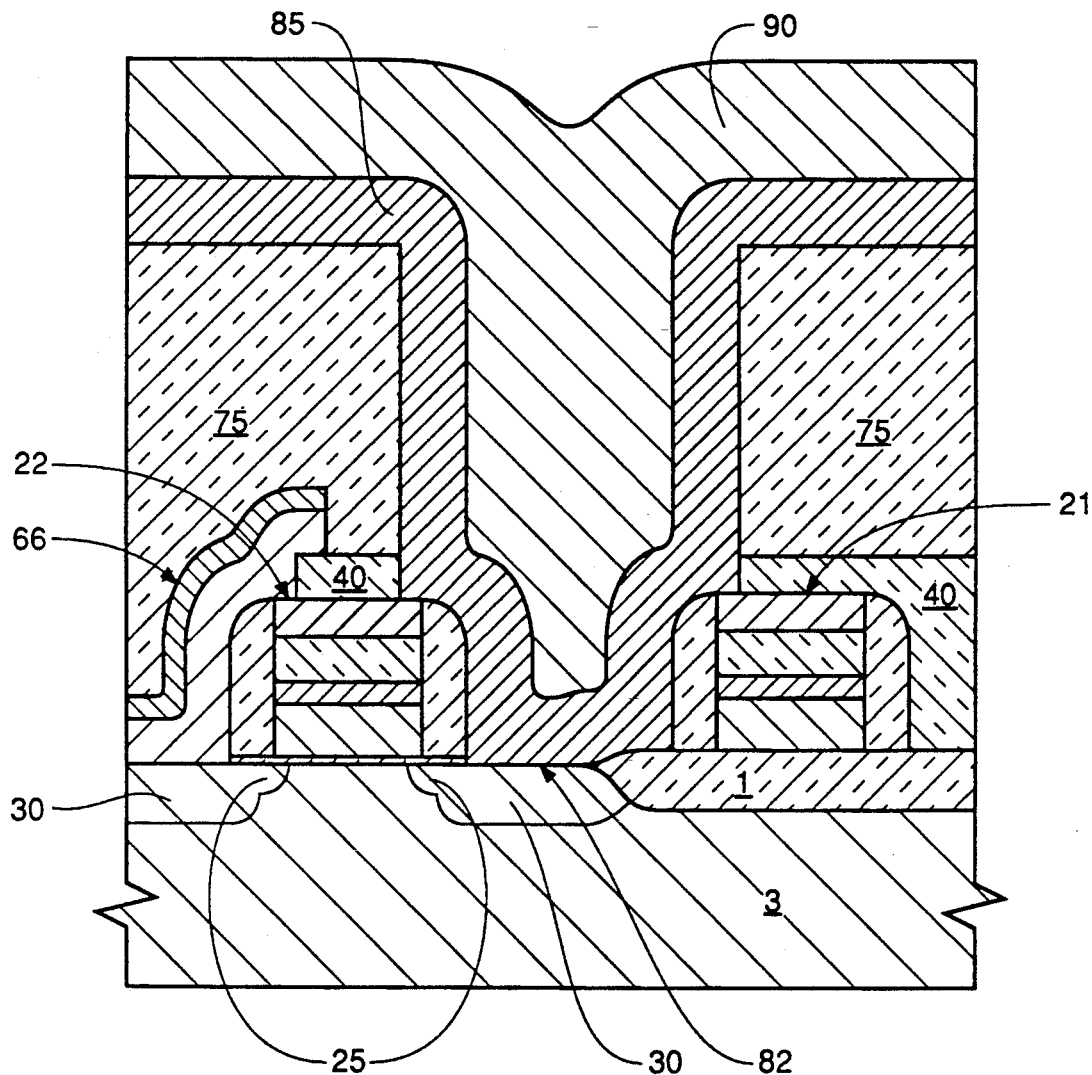
FIG. 7 is portion of the cross-sectional view of the wafer portion of FIG. 6 following the deposition of a IKA thick TiN layer and a tungsten fill of the opening.

FIG. 7 is a portion of the wafer portion shown in FIG. 6. In FIG. 7 a TiN deposition 85 has been followed by tungsten fill deposition 90. The TiN deposition typically has a thickness equal to 1KA. A cavity having a similar thickness is capable of accepting dielectric and cell polysilicon depositions.

TiN is a diffusion barrier metal providing a diffusion barrier between the N+ junction and the tungsten. The TiN also provides a low contact resistance without damaging the contact area of the substrate. TiN 85 is deposited first since it can be uniformally and evenly distributed to contact the previously fabricated areas and it provides a good contact medium for the subsequent tungsten fill 90. The TiN 85 also provides electrical communication between the substrate contact areas 82 and the tungsten 90. It is conceivable that TiN may be replaced with other diffusion barrier materials having similar properties.

Tungsten is a highly conductive refractory metal that can withstand high temperatures in the range of 600° C. to 900° C. This is necessary due to a subsequently deposited polysilicon layer. The polysilicon deposition is typically in the vicinity of 650° C. The tungsten can be replaced with other refractory metals comprising $WSi_x$, titanium, and titanium silicide. It is conceivable that as technology advances processing steps subsequent to the tungsten deposition may be performed at higher or lower temperatures. The temperature parameters qualify the refractory metal and are indicative of the current process. Since the temperature parameters may change as the fabrication process evolves, the refractory metals applicable to the process may change accordingly.

Figure 8:
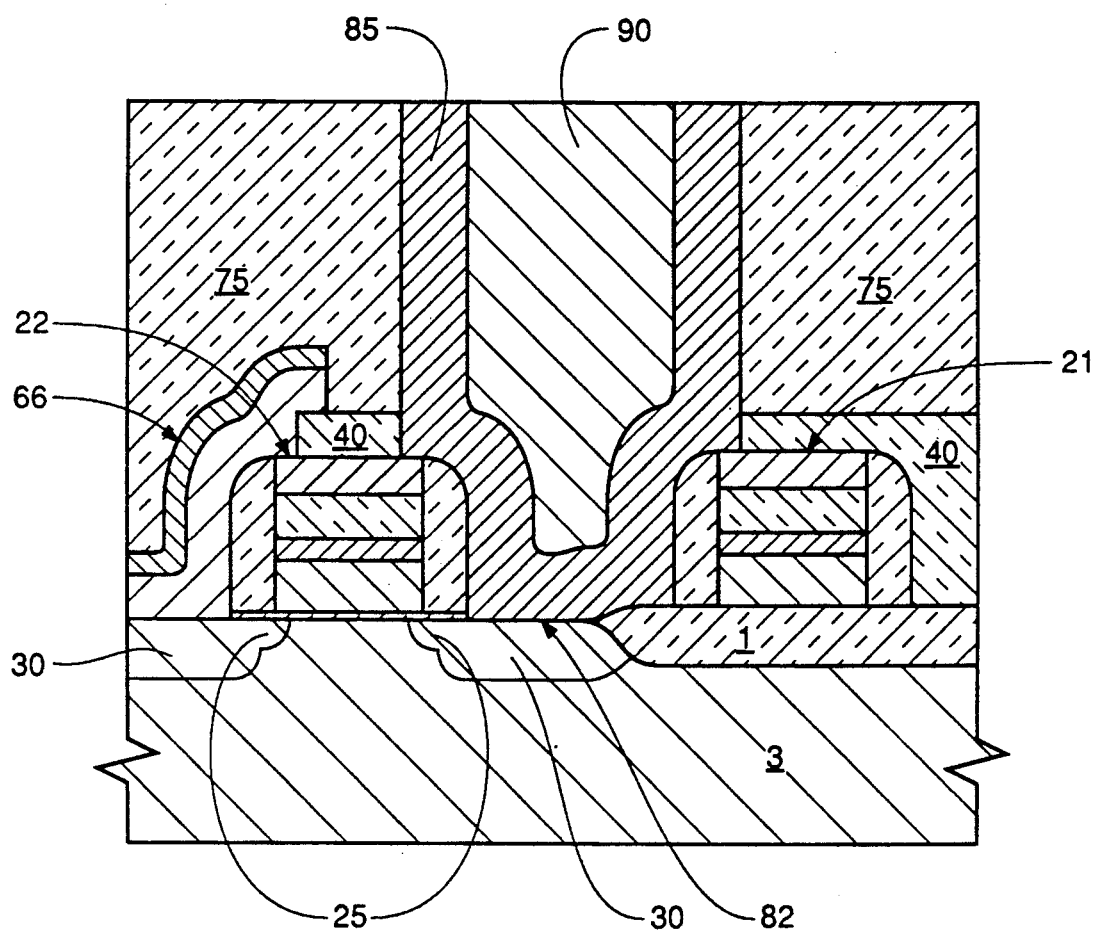
FIG. 8 is a cross-sectional view of the wafer portion of FIG. 7 following a planarization of the TiN and tungsten to form a plug.

The tungsten 90 and TiN 85 are shown in FIG. 8 after a mechanical etch to effect planarization of the tungsten 90, TiN 85 and thick oxide 75.

Figure 9:
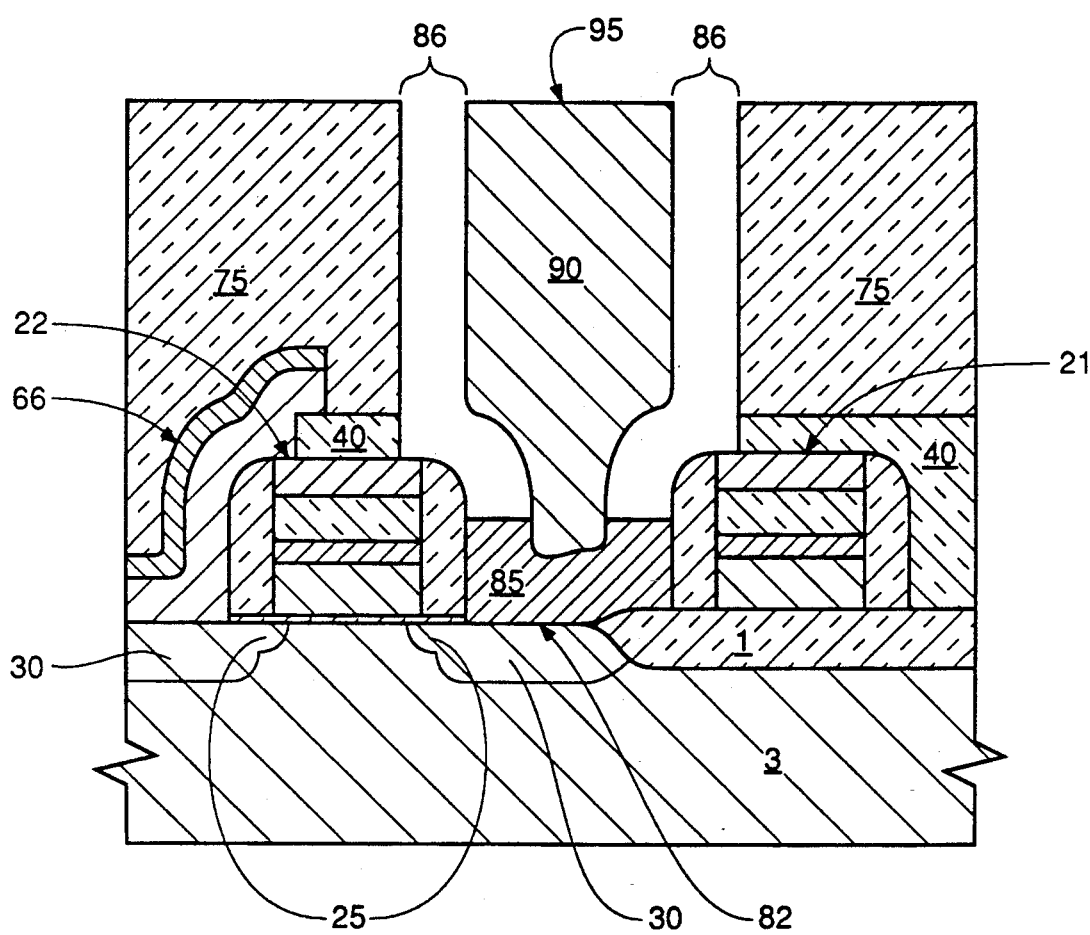
FIG. 9 is a cross-sectional view of the wafer portion of FIG. 8 following a controllable and selective TiN etch.

TiN can be selectively etched over tungsten. In FIG. 9 the TiN 85 is controllably etched by a piranha (either wet or vapor) etch method to form trenches 86 while retaining a portion of TiN 85 to contact the contact area 82 of the substrate 3. Any periphery contacts already fabricated must be protected by a mask during the piranha etch. The trenches 86 are each approximately 1KA wide extending approximately 2 microns from the top of the tungsten. The retained portion of TiN 85 envelops a lower portion of the tungsten 90. The TiN 85 and tungsten 90 thus formed comprise the lower capacitor plate 95. The trenches 86 increase the size of the storage node plate thus increasing capacitance.

Figure 10:
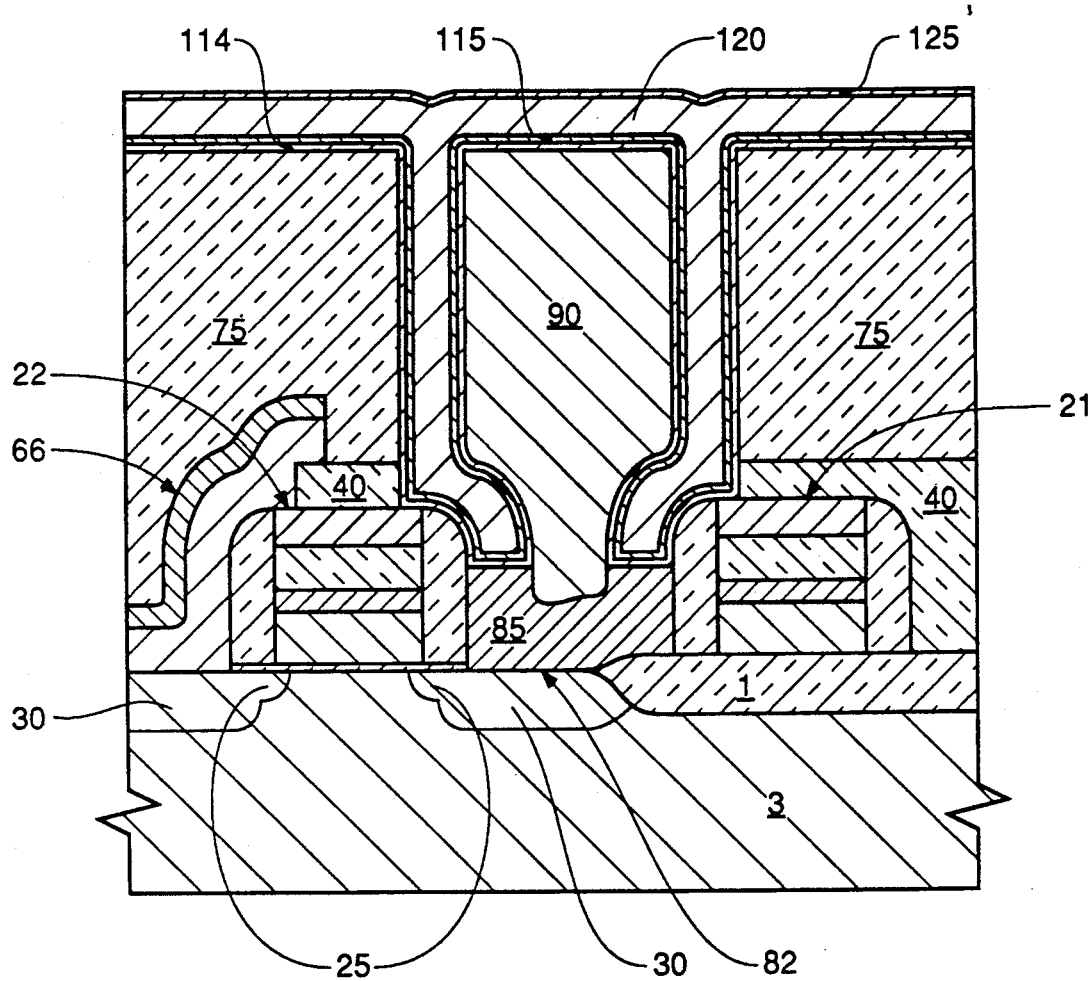
FIG. 10 is a cross-sectional view of the wafer portion of FIG. 9 following blanket depositions of a thin silicide layer and a dielectric layer and following a deposition of a cell polysilicon. A nitride layer is deposited to overlie the cell polysilicon.

In FIG. 10 a thin polysilicon layer 114 is blanket deposited to overlie exposed portions of the oxide 75, the TiN 85, and tungsten 90. The polysilicon layer 114 typically has a thickness of 50 Å and provides a silicon surface on which to blanket deposit a thin dielectric layer 115 typically having a thickness of 100Å. The dielectric layer typically comprises of silicon nitride, although other dielectric materials such as silicon dioxide are equally viable. An optional wet anneal may be performed subsequent to the silicon nitride deposition to oxidize the silicon in pinholes of the nitride. The wet anneal improves dielectric breakdown properties of the capacitor thus formed. The dielectric is typically silicon nitride. A thick cell polysilicon layer 120 is deposited to overlie the dielectric layer and completely fills in the trenches 86 previously formed. The thick cell polysilicon layer 120 is subjected to an insitu phosphorous diffusion doping to decrease its resistivity. The cell plate comprises the cell polysilicon layer 120. In order to protect the thick cell polysilicon layer 120 during subsequent oxidization steps of the fabrication process a thin layer of oxidation resistant silicon nitride 125 is blanket deposited to overlie the thick cell poly layer 120.

Figure 11:
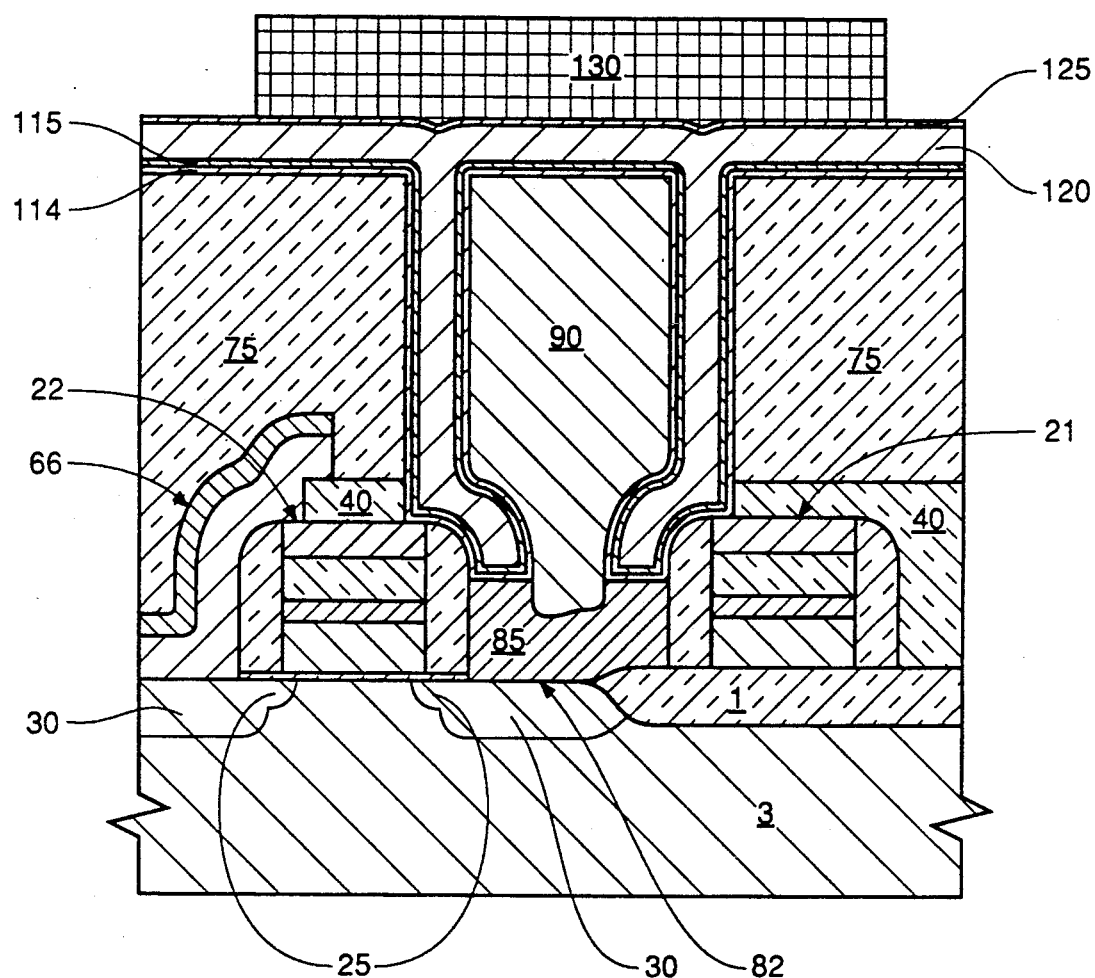
FIG. 11 is a cross-sectional view of the wafer portion of FIG. 10 following patterning of the storage capacitor with photoresist.

The cell polysilicon layer is patterned only within the storage capacitor with photoresist mask 130 as shown in FIG. 11.

Figure 12:
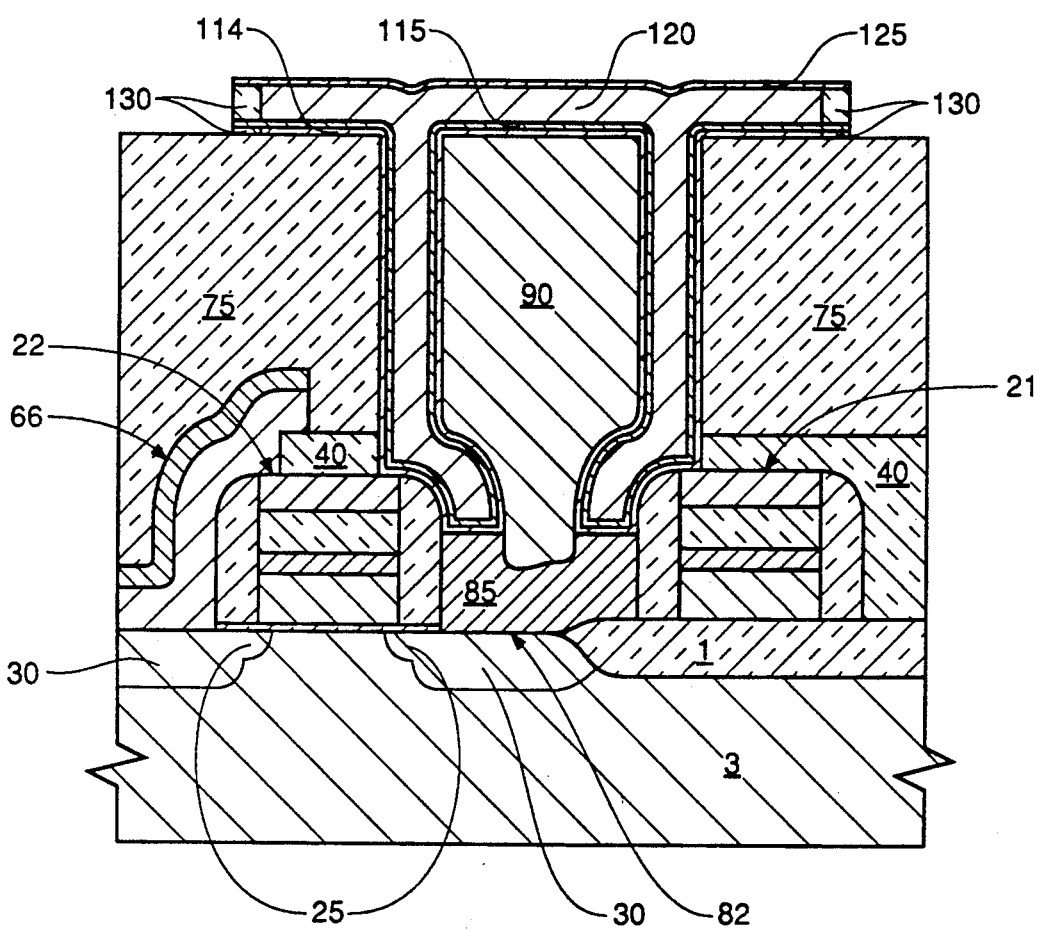
FIG. 12 is a cross-sectional view of the wafer portion of FIG. 11 following an RIE etch of the nitride layer, the cell polysilicon, the dielectric layer and the silicide layer, and following the removal of the photoresist.

In FIG. 12 polysilicon layer 114, cell polysilicon layer 120, and dielectric layer 115 and nitride layer 125 are RIE etched in the unmasked areas, and the photoresist 130 as shown in FIG. 11 is removed. Oxide 130 is grown to insulatively seal the sides of the polysilicon layers 114 and 120.

Figure 13:
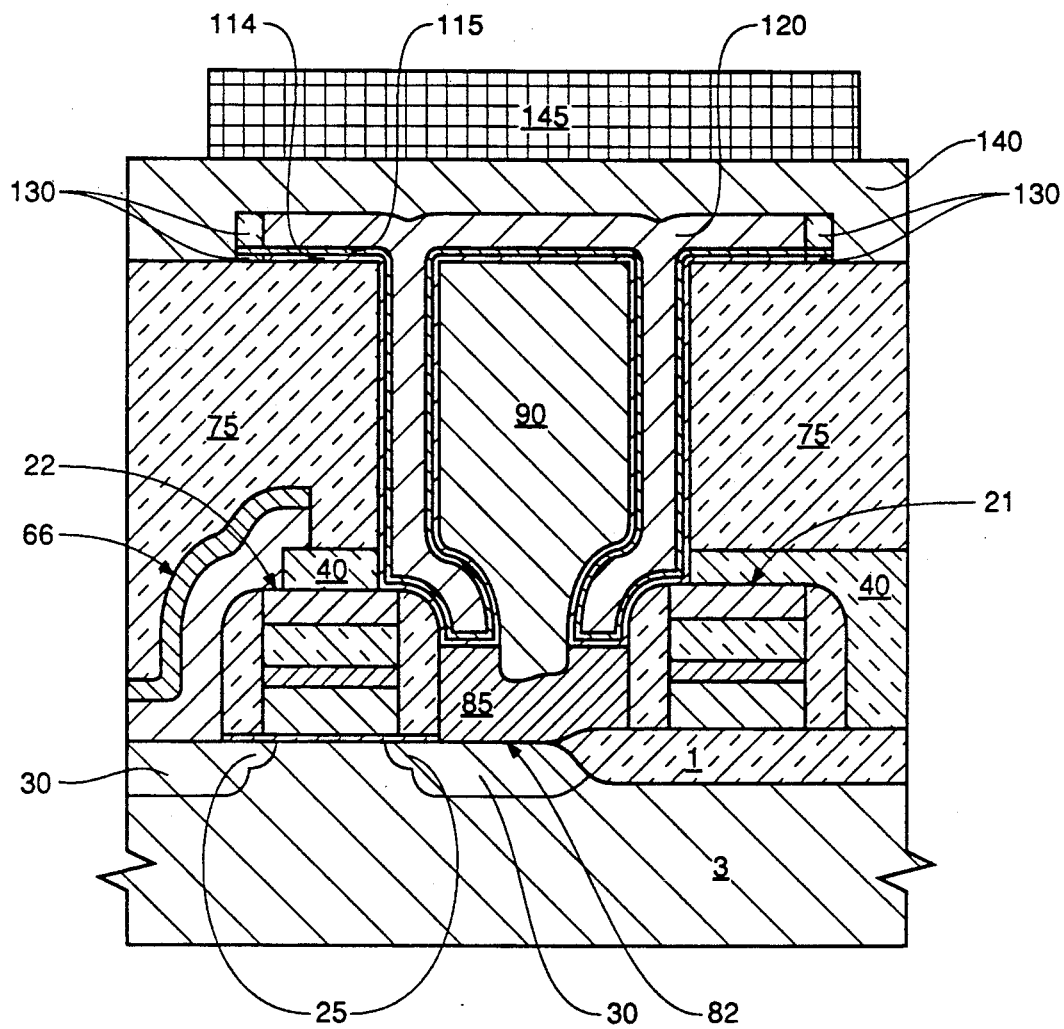
FIG. 13 is a cross-sectional view of the wafer portion of FIG. 12 following the deposition of a conductive layer and following the noncritical patterning of the cell array.

In FIG. 13 the nitride layer 125 shown in FIG. 12 is RIE etched and a layer of conductive material 140 is deposited to create a cell poly interconnect and eliminate a cell poly mask. Conductive material 140 functions as a cell polysilicon interconnect and eliminates a cell polysilicon mask. The conductive material 140 preferably comprises a metal such as aluminum, tungsten, Al/Si/Cu, or another aluminum/copper alloy. This layer of conductive material 140 is typically used throughout the circuit periphery. In order to retain the conductive material overlying and in contact with portions of cell polysilicon layer 120 the conductive material 140 is masked by photoresist 145 in a noncritical alignment pattern over the cell array in order to connect all the cell polysilicon over the storage node. Since the cell polysilicon is aligned with the storage node poly pattern, a cell polysilicon masking step is eliminated.

Figure 14:
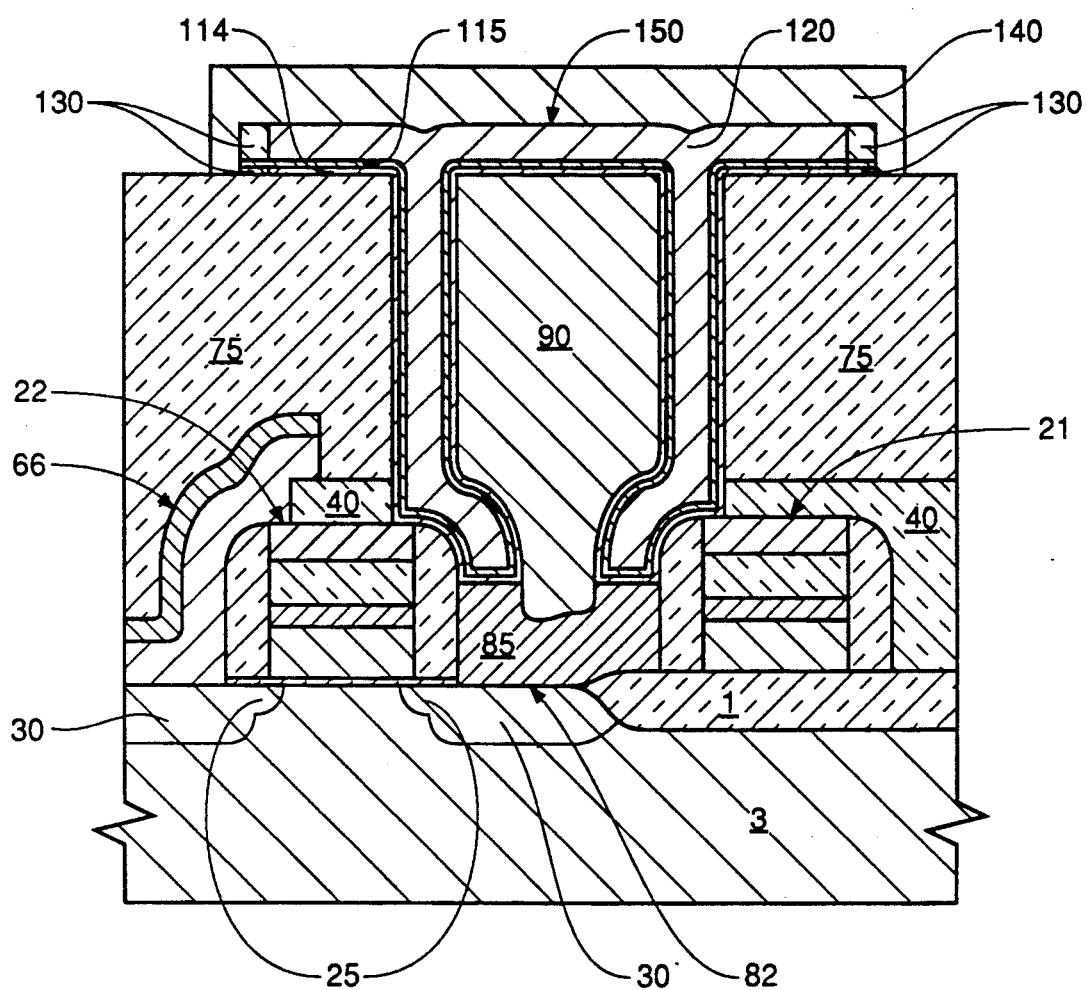
FIG. 14 is a cross-sectional view of the wafer portion of FIG. 13 following an RIE metal etch of the conductive layer and following the removal of the photoresist pattern.

In FIG. 14 the unmasked conductive material 140 has been RIE metal etched, the photoresist 145 shown in FIG. 13 has been removed and the fabrication of storage capacitors 150 is complete. The lower capacitor plate 95 of storage capacitors 150 comprise the tungsten 90 and titanium nitride 85 portions. The cell plate comprises the thick cell polysilicon layer 120. The conductive material 140 provides electrical communication between the cell plates of the capacitors 150 fabricated by the method of the first embodiment. The cell plate and storage node capacitor plate are electrically insulated from each other by the dielectric layer 145.

Figure 15:
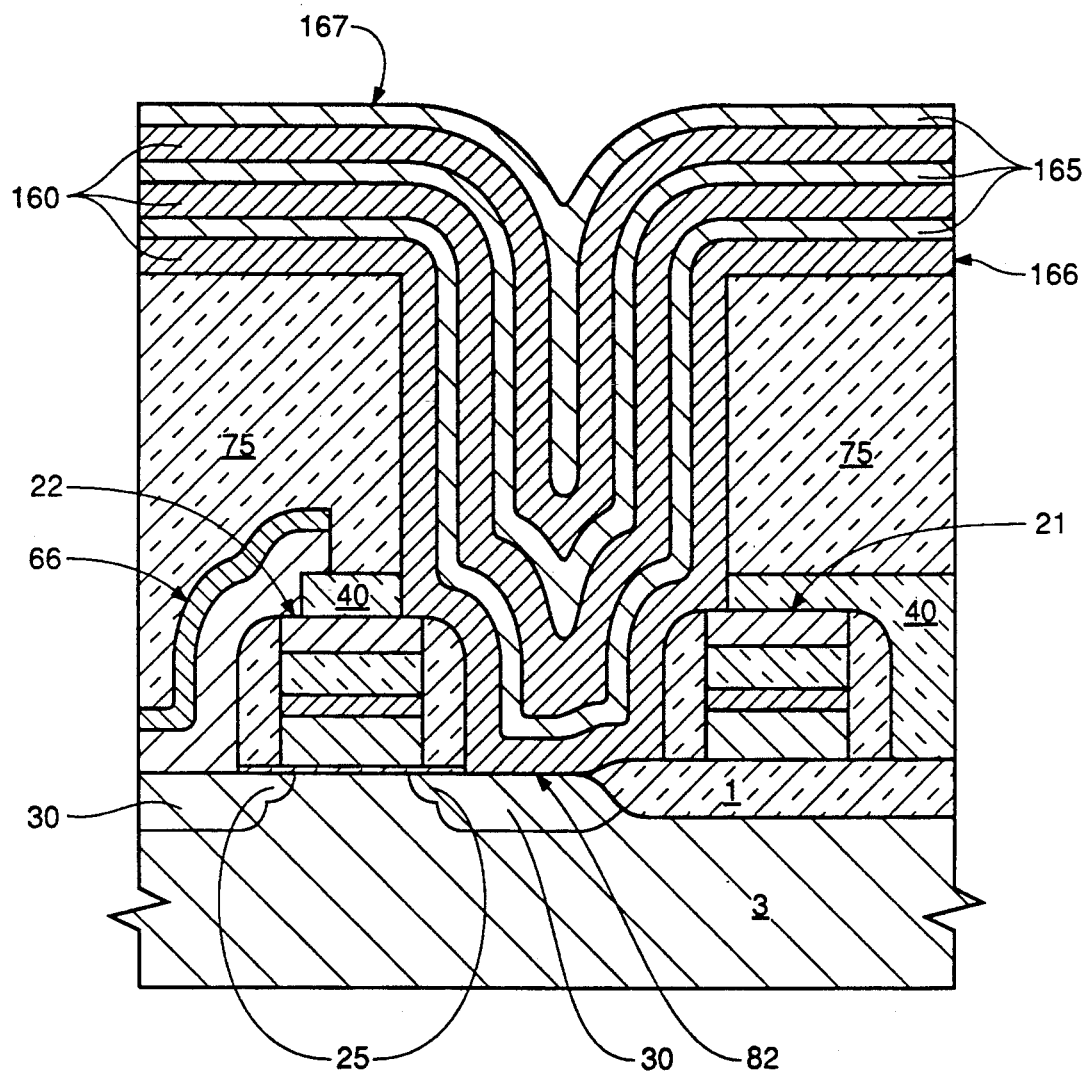
FIG. 15 is a cross-sectional view of a portion of the wafer portion of FIG. 6 following alternating depositions of TiN and Tungsten.

The process steps of the second embodiment of the invention are identical to the process steps of the first embodiment for the steps described relative to FIGS. 1-6. In the second embodiment of the invention, the openings 82 formed in FIG. 6 are deposited with alternating layers of TiN 160 and tungsten 165 as shown in FIG. 15 which is a portion of the wafer portion shown in FIG. 6. The initial deposit 166 being TiN and the final deposit 167 being tungsten. Although the total number of layers is optional at least 2 tungsten layers and 2 TiN layers are employed.

Figure 16:
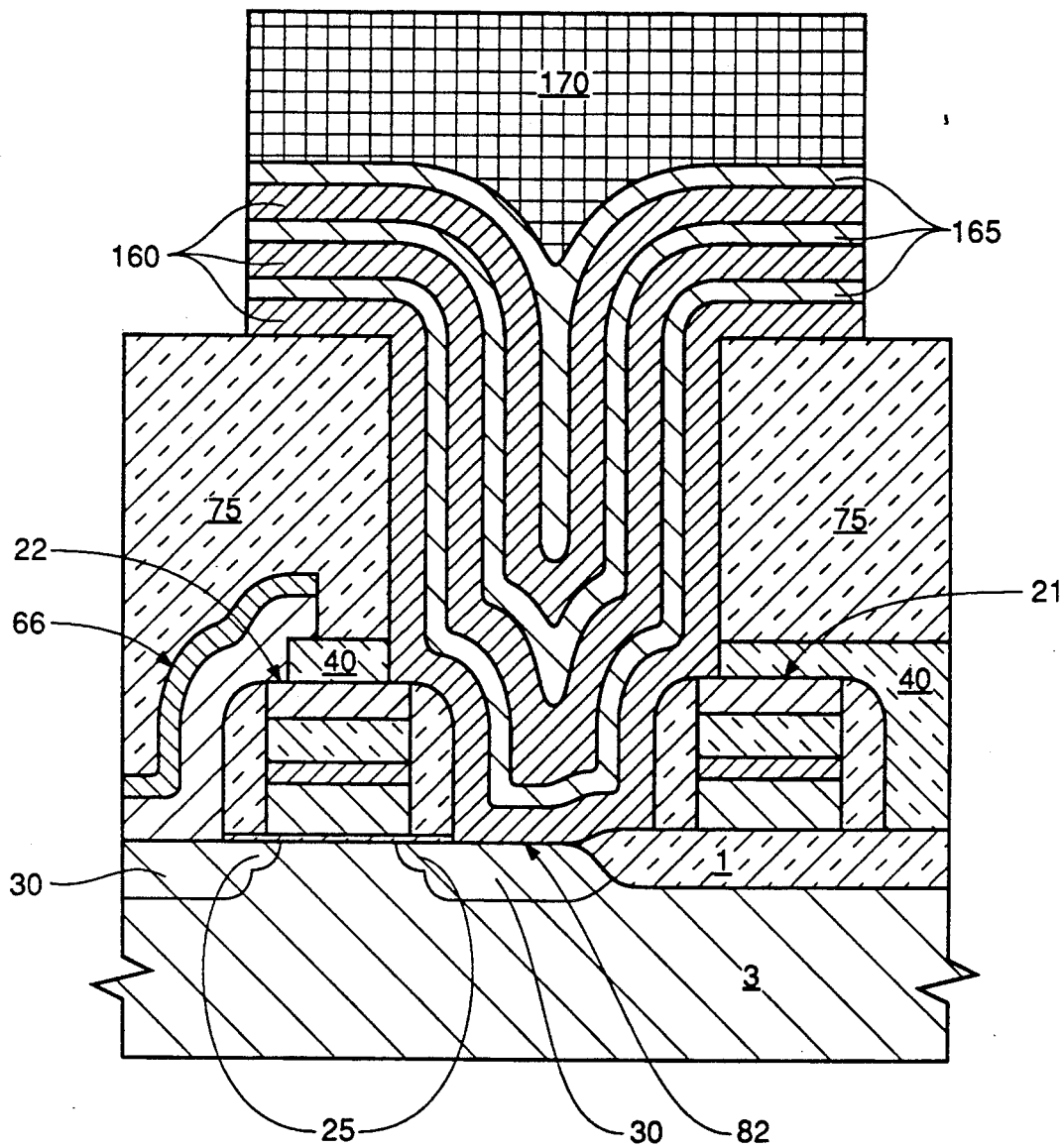
FIG. 16 is a cross-sectional view of the wafer portion of FIG. 15 following the masking and RIE etch of the alternating depositions.

In FIG. 16 the storage node is defined by masking the alternating layers with a photoresist pattern 170. The alternating layers are then RIE etched.

Figure 17:
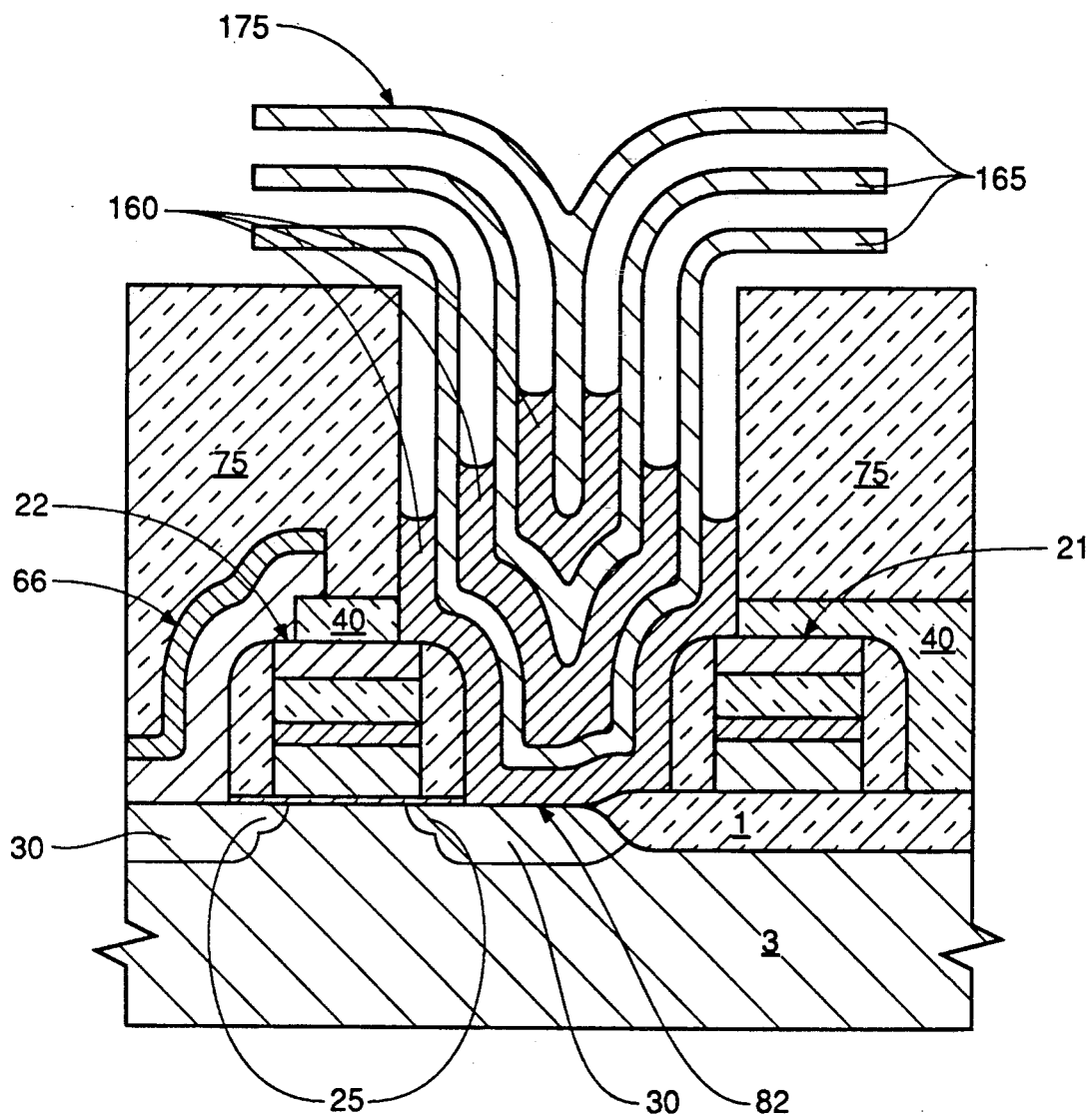
FIG. 17 is a cross-sectional view of the wafer portion of FIG. 16 following a selective and controllable etch of the TiN layers and removal of the photoresist.

In FIG. 17 the photoresist pattern 170 shown in FIG. 16 is removed and the fabrication of the storage node is completed by selectively and controllably etching the TiN by a piranha (either wet or vapor) etch method to form tungsten fingers 175 extending substantially normally from the TiN 160 retained after the etch. Any periphery contacts already fabricated must be protected by a mask during the piranha etch. A piranha etch is an etch wherein the etch solution comprises a solution of hydrogen peroxide plus sulfuric acid. The fingers diverge and are elevationally stacked in a parallel configuration over the oxide 75. The total height of the stacked portion of the storage node is dependent on the number of layers deposited and the thickness of the layers.

Figure 18:
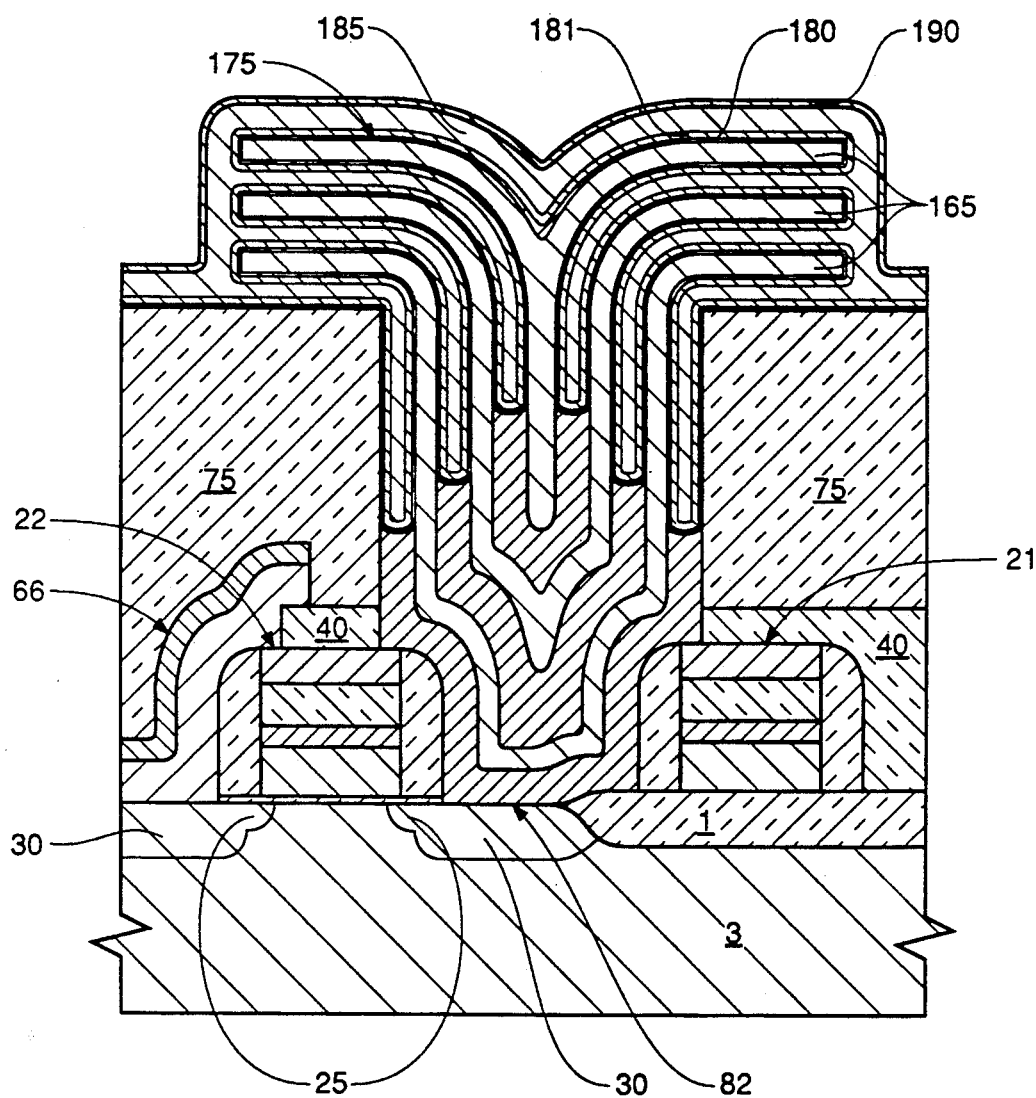
FIG. 18 is a cross-sectional view of the wafer portion of FIG. 17 following blanket depositions of a thin silicide layer and a dielectric and following a deposition of cell polysilicon. A nitride layer is deposited to overlie the cell polysilicon.

In FIG. 18 a thin polysilicon layer 180 typically having a thickness of 50 Å is deposited to overlie all exposed surfaces. The polysilicon layer 180 provides a silicon surface for a subsequent dielectric deposition. A thin dielectric layer 181 comprising silicon nitride is deposited to overlie the polysilicon 180. The dielectric layer 181 typically has a thickness of 100Å. An optional wet anneal may be performed subsequent to the deposition of the dielectric layer 181 to oxidize the silicon in pinholes of the nitride. A cell polysilicon layer 185 is deposited to overlie the dielectric layer. The cell polysilicon 185 layer is subjected to an insitu phosphorous diffusion doping to decrease its resistivity. In order to protect the thick cell polysilicon layer 850 during subsequent oxidization steps of the fabrication process a thin layer of oxidation resistant silicon nitride 190 is blanket deposited to overlie the thick cell polysilicon layer 185.

Figure 19:
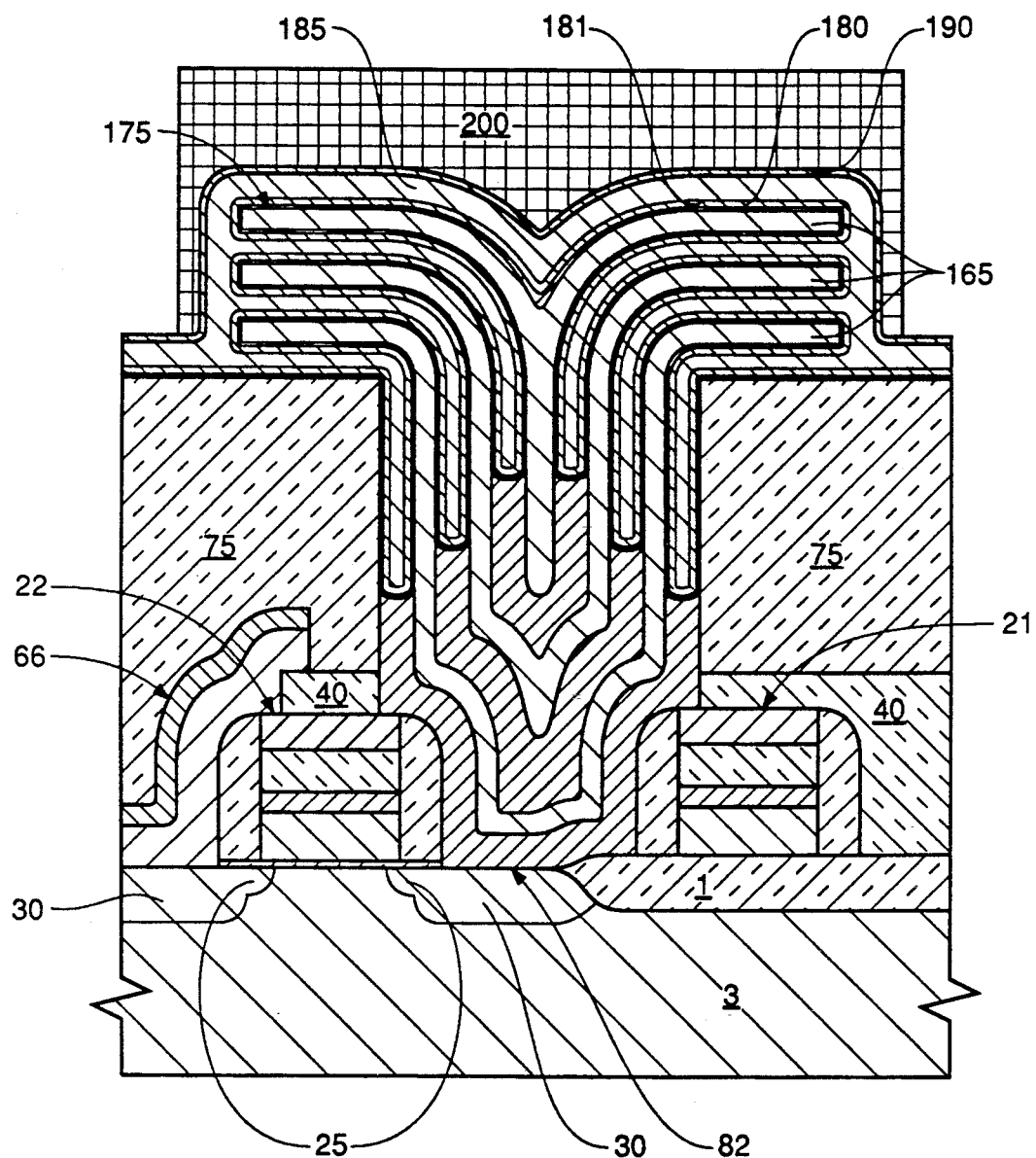
FIG. 19 is a cross-sectional view of the wafer portion of FIG. 18 following patterning of the storage capacitor with photoresist.

The cell polysilicon layer is patterned only within the storage capacitor with photoresist mask 200 as shown in FIG. 19.

Figure 20:
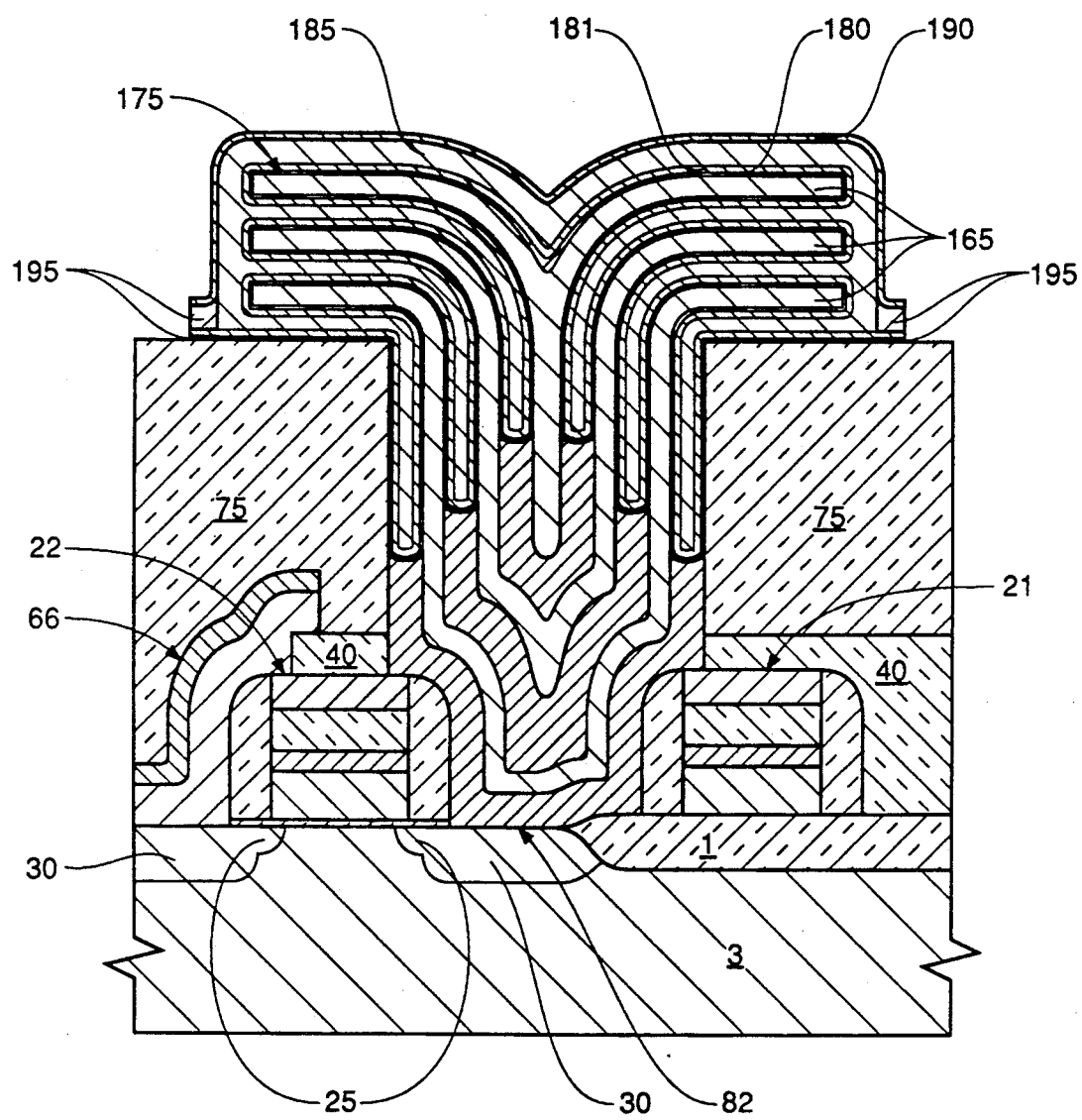
FIG. 20 is a cross-sectional view of the wafer portion of FIG. 19 following an RIE etch of the nitride layer, the cell polysilicon, the dielectric layer and the silicide layer, and following the removal of the photoresist.

In FIG. 20 polysilicon layer 180, cell polysilicon layer 185, dielectric layer 181, and nitride layer 190 are RIE etched in the unmasked areas, and the photoresist 200 as shown in FIG. 19 is removed. Oxide 195 is grown to insulatively seal the sides of the polysilicon layers 180 and 185.

Figure 21:
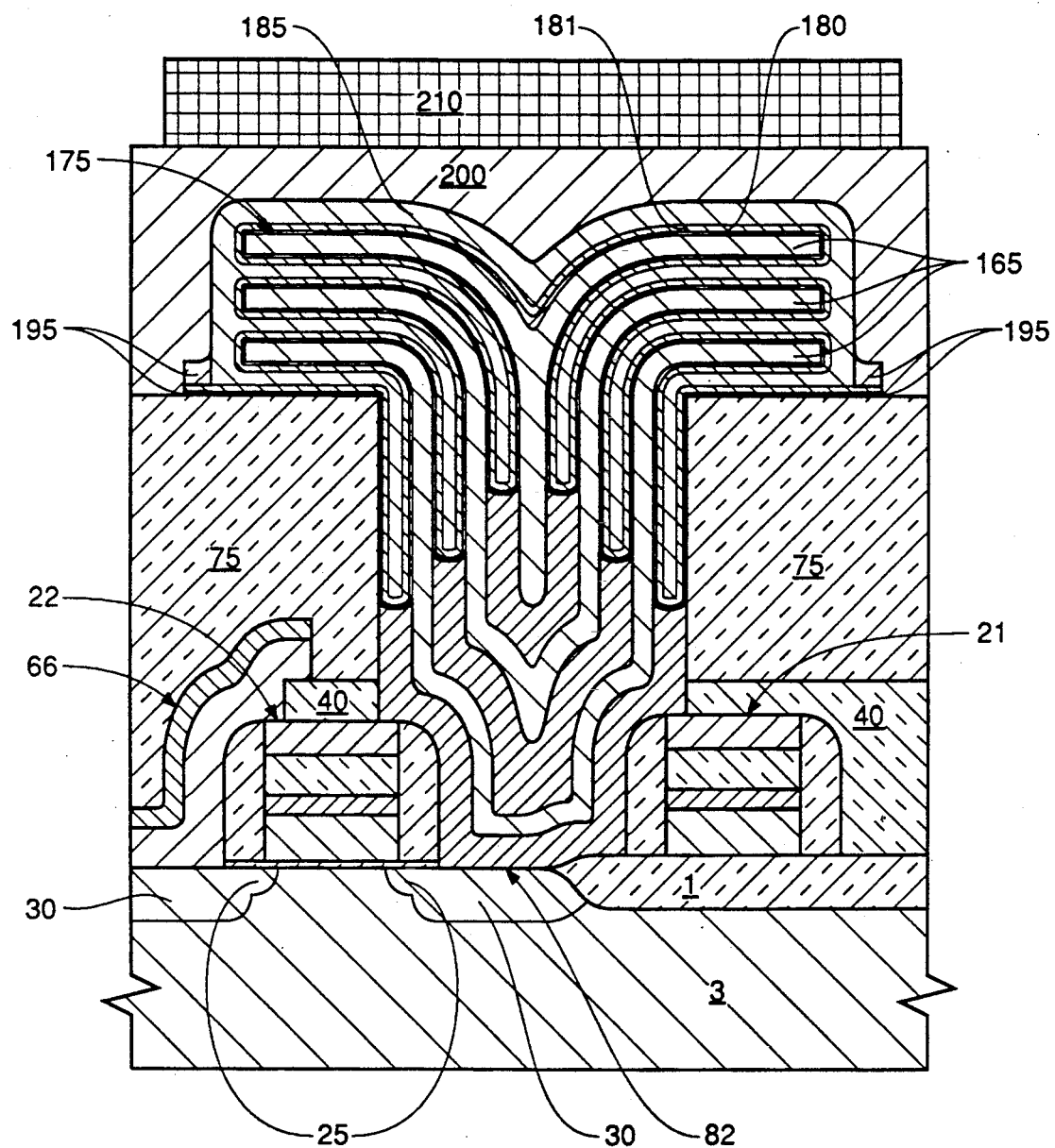
FIG. 21 is a cross-sectional view of the wafer portion of FIG. 20 following the deposition of a conductive layer and following the noncritical patterning of the cell array.

In FIG. 21 the nitride layer 190 shown in FIG. 20 is RIE etched and a layer of conductive material 200 is deposited to create a cell poly interconnect and eliminate a cell poly mask. Conductive material 200 functions as a cell polysilicon interconnect and eliminates a cell polysilicon mask. The conductive material 200 preferably comprises a metal such as aluminum, tungsten, Al/Si/Cu, or another aluminum/copper alloy. This layer of conductive material 200 is typically used throughout the circuit periphery. In order to retain the conductive material overlying and in contact with portions of cell polysilicon layer 185 the conductive material 200 is masked by photoresist 210 in a noncritical alignment pattern over the cell array in order to connect all the cell polysilicon over the storage node. Since the cell polysilicon is aligned with the storage node poly pattern, a cell polysilicon masking step is eliminated.

Figure 22:
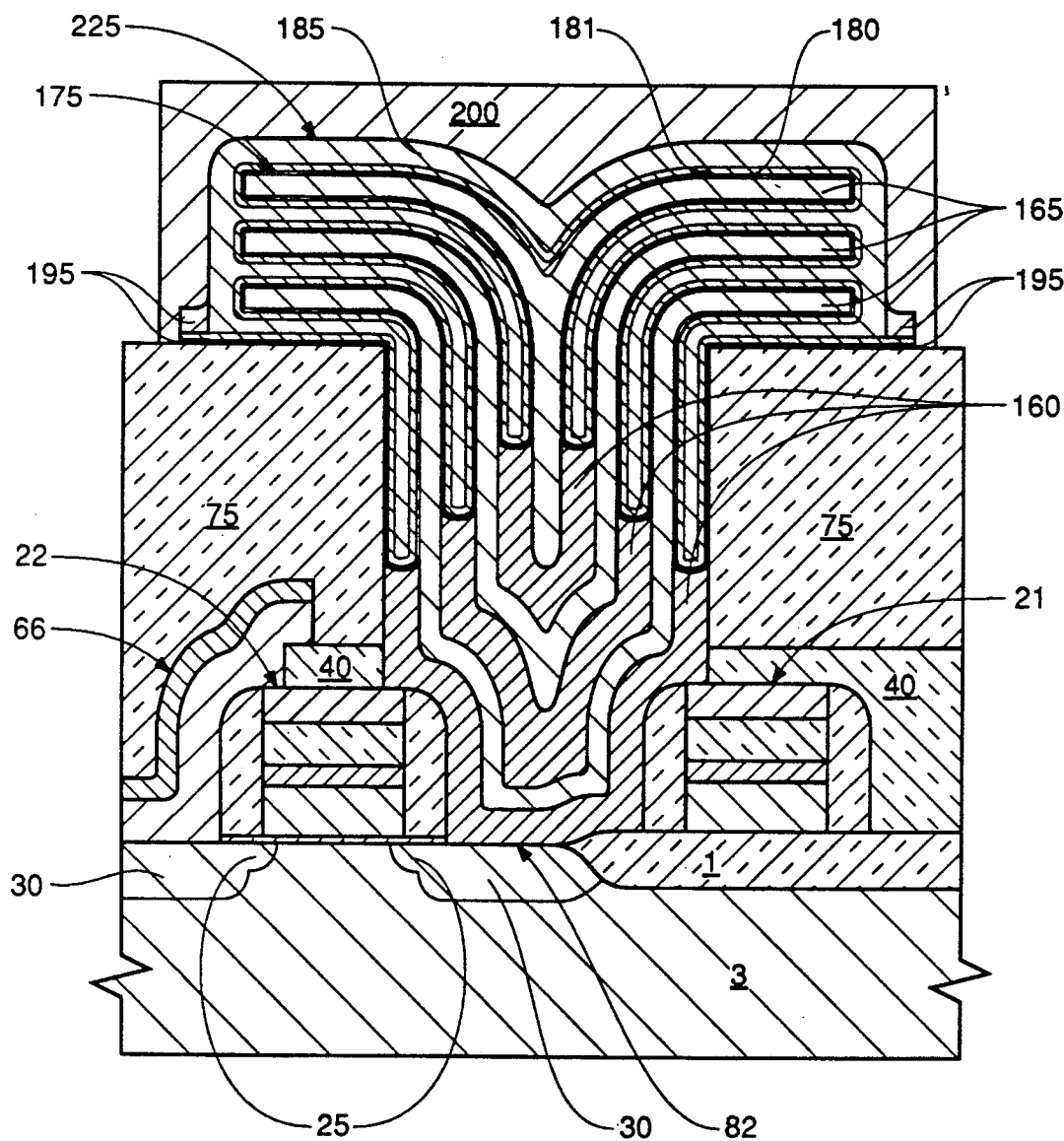
FIG. 22 is a cross-sectional view of the wafer portion of FIG. 21 following an RIE metal etch of the conductive layer and following the removal of the photoresist pattern.

In FIG. 22 the unmasked conductive material 200 has been RIE metal etched, the photoresist 210 shown in FIG. 21 has been removed and the fabrication of storage capacitors 225 is complete. The lower capacitor plate 175 of storage capacitors 225 comprise the tungsten 165 and titanium nitride 160 portions. The cell plate comprises the thick cell polysilicon layer 185. The conductive material 200 provides electrical communication between the cell plates of the capacitors 225 fabricated by the method of the first embodiment. The cell plate and storage node capacitor plate are electrically insulated from each other by the dielectric layer 181. At this juncture the cell polysilicon may be masked and etched and a conductive material may be deposited as in the first embodiment to create the cell polysilicon interconnect.

The invention allows the vertical portion of a DRAM device to be utilized as the storage cell thus maximizing die space in the horizontal direction, and reducing the stack capacitor height prior to contacts. Controllably etching the TiN increases capacitor area and capacitance. A mask step is eliminated over previous methods since there is no cell polysilicon mask. Thus the increase in capacitance is effected using minimal masking steps and minimal surface area of the DRAM device.

The process also facilitates the effective use of a buried digit line configuration. There are no digit line stringers, thus yield is increased.

Although as described the first embodiment is applicable to 4-megabit through 64-megabit, and the second embodiment is typically employed in DRAMs containing up to 256 megabit DRAM cells, the process is not limited to these uses.

Although polycrystalline silicon is used in the capacitor fabrication of the preferred embodiments, amorphous and monocrystalline silicon may also be used.

Although two embodiments of the invention have been herein described, it will be apparent to one skilled in the art that changes and modifications may be made thereto without departing from the spirit and scope of the invention as claimed.

We claim:

1. A method for forming at least one capacitor in a semiconductor comprising:
   a) forming a dielectric isolation interlayer to overlie previously fabricated semiconductor structures and a substrate of said semiconductor device;
   b) planarizing said interlayer;
   c) etching an opening in said interlayer in order to expose a contact area of said substrate;
   d) blanket depositing an initial layer of diffusion barrier material to overlie said etched interlayer, said contact area, and previously fabricated structures exposed during said etching, said depositing sufficient to effect minimal substrate damage, said diffusion barrier material having a substantially low contact resistance, said depositing sufficient to minimize diode leakage, said initial layer of said diffusion barrier material having a thickness, wherein a cavity having said thickness is capable of accepting depositions of a dielectric material and a conducive material;
   e) depositing a refractory metal to overlie said layer of diffusion barrier material;
   f) defining a region for formation of the capaoitor;
   g) controllably and selectively etching said diffusion barrier material to form an opening having a thickness equal to a thickness of said diffusion barrier material, a portion of said diffusion barrier material being retained to overly said contact area and retained to envelop a lower portion of said refractory metal, said etching exposing an upper portion of said refractory metal, said diffusion barrier material and said refractory metal forming a first capacitor plate;
   h) blanket depositing a dielectric layer to overlie said refractory metal, said interlayer, said diffusion barrier material, and said previously fabricated structures; and
   i) blanket depositing a conductive layer to overlie said dielectric layer, said conductive layer forming a second capacitor plate, said dielectric layer capable of electrically insulating said first and second capacitor plates one from the other.

2. The method as specified in claim 1, wherein said defining further comprises planarizing said barrier diffusion material and said refractory material planar to said interlayer.

3. The method as specified in claim 1, wherein said defining further comprises:
   a) patterning said diffusion barrier material and said refractory metal with photoresist in regions reserved for capacitor formation;
   b) anisotropically etching said diffusion barrier material and said refractory metal such that said diffusion barrier material and said refractory metal are retained in said regions reserved for capacitor formation; and
   c) removing said photoresist.

4. The method as specified in claim 1, further comprising alternately depositing alternating layers comprising at least two layers of said diffusion barrier material and at least one layer of said refractory metal, said alternating layers of said diffusion barrier material having a thickness substantially equal to said thickness of said initial layer.

5. The method as specified in claim 4, wherein said exposing said upper portion of said refractory metal further comprises forming fingers in said upper portion of said refractory metal as a result of said selectively etching of said diffusion barrier material, said fingers extending substantially normally to said diffusion barrier material retained following said etch, said fingers diverging away from a center of said self-aligned opening to a position substantially parallel to and elevationally overlying said previously fabricated structures, and wherein said conductive material envelopes each one of said fingers.

6. The method as specified in claim 1, wherein said depositing said conductive layer further comprises:
   a) depositing a polysilicon layer; and
   b) subjecting said polysilicon layer to an insitu phosphorous diffusion doping.

7. The method as specified in claim 1, further comprising:
   a) patterning said interlayer with a contact photoresist pattern prior to said etching of said opening in said interlayer, said contact photoresist pattern also patterning periphery contacts;
   b) removing said photoresist subsequent to said etch step; and
   c) protecting said periphery contacts during said etching of said diffusion barrier material.

8. The method as specified in claim 1, wherein said forming said interlayer further comprises depositing a first oxide layer and depositing a second oxide layer to overlie said first oxide layer.

9. The method as specified in claim 8, wherein said depositing said first oxide layer comprises depositing an undoped oxide layer.

10. The method as specified in claim 8, wherein said depositing said second oxide layer comprises depositing a substantially thick doped borophosphosilicate glass oxide layer.

11. The method as specified in claim 1, further comprising depositing a thin polysilicon layer to overlie said barrier diffusion material, said refractive metal layer, said interlayer and said previously fabricated structures, said depositing providing a silicon surface to accept said blanket deposition of said dielectric layer.

12. The method as specified in claim 1, further comprising performing a wet anneal subsequent to said depositing said dielectric layer.

13. A method for forming a plurality of capacito semiconductor device comprising:
   a) creating an interlayer to overlie previously fabricated semiconductor structures and a substrate of the semiconductor device;
   b) masking said interlayer with a contact photoresist pattern, said masking defining self-aligned regions in which to form said plurality of capacitors, said contact photoresist pattern also patterning periphery contacts;
   c) etching said interlayer in order to expose a contact area of said substrate and in order to form an opening in said interlayer;
   d) removing said photoresist;
   e) depositing a layer of diffusion barrier material to overlie said interlayer, said previously fabricated structures, and said contact area, said depositing said laye of diffusion barrier material effecting minimal substrate damage, said diffusion barrier material having a substantially low contact resistance, said depositing minimizing diode leakage, said layer of diffusion barrier material having a thickness, a cavity having said thickness capable of accepting depositions of a dielectric material and polysilicon;
   f) depositing a refractory metal to overlie said layer of diffusion barrier material;
   g) defining regions for formation of said plurality of capacitors;
   h) controllably and selectively etching said diffusion barrier material to form an opening having a thickness equal to said thickness of said diffusion barrier material, a portion of said diffusion barrier material retained to overly said contact area and retained to envelop a lower portion of said refractory metal, said etching exposing an upper portion of said refractory metal, said diffusion barrier material and said refractory metal forming first capacitor plates for the plurality of capacitors, said etching exposing portions of said interlayers, said previously fabricated structures, said diffusion barrier material, and said refractory metal;
   i) protecting said periphery contacts during said etching of said diffusion barrier material;
   j) depositing a substantially thin film of silicide to overlie said exposed portions;
   k) depositing a dielectric layer to overly said thin film of silicide;
   l) performing a wet anneal;
   m) depositing an accepting layer to overlie said dielectric layer;
   n) doping said accepting layer with an impurity thus creating a doped accepting layer having more conductivity than said accepting layer, said doped accepting layer forming second capacitor plates of the plurality of capacitors;
   o) blanket depositing a protective layer to overlie said accepting layer, said protective layer resistant to oxidation;
   p) defining said plurality of capacitor regions with a capacitor region photoresist pattern, said photoresist pattern protecting said capacitor regions during a subsequent etch; and
   q) etching said protective layer, said accepting layer, said dielectric layer, and said film of silicide, said film of silicide and said accepting layer having exposed sides, said etching forming said plurality of capacitors.

14. The method as specified in claim 13, further comprises forming interconnect lines for providing electrical communication between the capacitors of said plurality.

15. The method as specified in claim 14, wherein said forming said interconnect lines further comprises:
   a) removing said capacitor region photoresist pattern;
   b) oxidizing said exposed sides, said oxidizing electrically insulating said exposed sides, said protective layer protecting a top portion of said accepting layer from oxidizing;
   c) removing said protective layer;
   d) depositing an interconnect material to overlie and be in electrical communication with said accepting layer;

e) defining interconnect lines for providing electrical communication between said capacitors of said plurality with an interconnect photoresist pattern;

f) etching said interconnect material to form said interconnect lines; and g) removing said interconnect photoresist pattern.

16. The method as specified in claim 13, wherein said accepting layer is silicon.

17. The method as specified in claim 13, wherein said doped accepting layer is a semiconductor.

18. The method as specified in claim 13, further comprising forming buried digit lines prior to steps for forming the capacitor.

19. The method as specified in claim 13, wherein said defining further comprises planarizing said barrier diffusion material, said refractory material and said interlayer.

20. The method as specified in claim 13, wherein said defining further comprises:

a) patterning said diffusion barrier material and said refractory metal with photoresist in regions reserved for capacitor formation;

b) anisotropically etching said diffusion barrier material and said refractory metal such that said diffusion barrier material and said refractory metal are retained in said regions reserved for capacitor formation; and c) removing said photoresist.

21. The method as specified in claim 13, further comprising alternately depositing alternating layers comprising at least two layers of said diffusion barrier material and at least one layer of said refractory metal layer.

22. The method as specified in claim 21, wherein said exposing said upper portion of said refractory metal further comprises forming fingers in said upper portion of said refractory metal as a result of said selectively etching of said diffusion barrier material, said fingers extending substantially normally to said diffusion barrier material retained following said etch, said fingers diverging away from a center of said self-aligned opening to a position substantially parallel to and elevationally overlying said previously fabricated structures, and wherein said conductive material envelopes each one of said fingers.

23. The method as specified in claim 13, wherein said creating said interlayer further comprises:

a) depositing an undoped dielectric isolation layer to overlie previously fabricated structures and a substrate of said semiconductor device;

b) depositing a substantially thick doped dielectric isolation layer to overlie said undoped interlayer; said doped and undoped isolation layers forming said interlayer; and c) planarizing said doped interlayer.

24. The method as specified in claim 23, further comprising forming digit lines prior to forming the plurality of capacitors by the method comprising:

a) masking said undoped interlayer with a first digit line photoresist to define a region reserved for digit line formation;

b) reactive ion etching said undoped interlayer in order to form a self-aligned opening in said undoped interlayer, said etching exposing at least a portion of said substrate;

c) removing said first digit line photoresist:

d) blanket depositing a digit line conductive layer to overlie at least said undoped interlayer and said exposed substrate;

e) blanket depositing a strapping layer to overlie said digit line conductive layer, said strapping layer having a lower resistance than said digit line conductive layer;

f) patterning said digit lines with a second digit line photoresist overlying digit line areas;

g) etching said digit line conductive layer and said strapping layer, said digit line conductive layer and said strapping layer retained in digit line areas, the retained layers forming said digit lines, said strapping layer reducing an overall resistance of said digit lines; and h) removing said second digit line photoresist.

* * * * *

UNITED STATES PATENT AND TRADEMARK OFFICE
CERTIFICATE OF CORRECTION

PATENT NO. : 5,168,073
DATED : December 1, 1992
INVENTOR(S) : Fernando Gonzalez, Roger R. Lee It is certified that error appears in the above-indentified patent and that said Letters Patent is hereby corrected as shown below:

Column 3, line 12, delete "seoond" and insert -- second --.

Column 4, line 8, delete "IKA" and insert -- 1KA --.

Column 12, line 2, delete "laye" and insert -- layer --.

Column 12, line 33, delete "1)" and inset -- 1) --.

Signed and Sealed this

Fourteenth Day of December, 1993

Attest:

BRUCE LEHMAN

*Attesting Officer*  *Commissioner of Patents and Trademarks*